US007081329B2

(12) United States Patent
Sugasaki et al.

(10) Patent No.: US 7,081,329 B2
(45) Date of Patent: Jul. 25, 2006

(54) PLANOGRAPHIC PRINTING PLATE PRECURSOR

(75) Inventors: Atsushi Sugasaki, Shizuoka-ken (JP); Kazuto Kunita, Shizuoka-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 48 days.

(21) Appl. No.: 10/671,776

(22) Filed: Sep. 29, 2003

(65) Prior Publication Data

US 2004/0131971 A1 Jul. 8, 2004

(30) Foreign Application Priority Data

Sep. 30, 2002 (JP) ............................ 2002-287819

(51) Int. Cl.
*G03F 7/038* (2006.01)
*G03F 7/095* (2006.01)
*G03F 7/033* (2006.01)

(52) U.S. Cl. .............................. 430/271.1; 430/273.1; 430/302; 430/910; 430/944; 430/964

(58) Field of Classification Search ............ 430/270.1, 430/271.1, 273.1, 281.1, 286.1, 287.1, 288.1, 430/302, 309, 434, 435, 494, 944, 945, 910, 430/964

See application file for complete search history.

(56) References Cited

U.S. PATENT DOCUMENTS 3,725,356 A 4/1973 Luders et al.
3,804,631 A 4/1974 Faust et al.
3,839,171 A 10/1974 Akamatsu et al.
3,930,865 A 1/1976 Faust et al.
4,019,972 A 4/1977 Faust
4,239,849 A 12/1980 Lipson et al.
4,476,215 A 10/1984 Kausch
4,499,163 A 2/1985 Ishimaru et al.
4,510,227 A 4/1985 Mohr et al.
4,537,855 A 8/1985 Ide
4,687,727 A 8/1987 Toyama et al.
4,772,538 A 9/1988 Walls et al.
4,950,581 A 8/1990 Koike et al.
4,952,478 A 8/1990 Miyagawa et al.
5,080,999 A 1/1992 Imai et al.
5,200,292 A 4/1993 Shinozaki et al.
5,246,816 A 9/1993 Yamasita et al.
5,340,699 A 8/1994 Haley et al.
5,641,608 A 6/1997 Grunwald et al.
5,705,322 A 1/1998 West et al.
5,919,601 A 7/1999 Nguyen et al.
5,952,154 A 9/1999 Barr et al.
5,965,319 A 10/1999 Kobayashi
6,013,412 A 1/2000 Aoshima
6,030,750 A 2/2000 Vermeersch et al.
6,309,792 B1 10/2001 Hauck et al.
6,399,689 B1 6/2002 Scarlette
6,423,462 B1 7/2002 Kunita
6,482,571 B1 11/2002 Teng
6,566,035 B1 * 5/2003 Aoshima ................ 430/270.1
6,576,401 B1 6/2003 Teng
6,681,200 B1 1/2004 Zee
6,733,948 B1 5/2004 Nakamura et al.
6,794,116 B1 9/2004 Oshima
6,858,374 B1 * 2/2005 Yanaka .................... 430/281.1
2001/0036598 A1 11/2001 Shimada et al.
2002/0051934 A1 5/2002 Nakamura et al.
2002/0055058 A1 5/2002 Takahiro
2002/0136987 A1 9/2002 Yasuhito
2002/0160295 A1 10/2002 Aoshima et al.
2002/0177074 A1 11/2002 Hoshi
2002/0182639 A1 12/2002 Fujimaki et al.
2002/0197564 A1 12/2002 Timpe et al.
2003/0008239 A1 1/2003 Fujimaki et al.
2003/0068575 A1 * 4/2003 Yanaka .................... 430/270.1
2003/0073032 A1 4/2003 Aoshima et al.
2003/0082478 A1 5/2003 Itakura et al.
2003/0146965 A1 8/2003 Fujimaki et al.
2003/0162127 A1 * 8/2003 Kikuchi .................. 430/275.1
2003/0186174 A1 10/2003 Nagase (Continued)

FOREIGN PATENT DOCUMENTS

CA 1338095 2/1996

(Continued)

OTHER PUBLICATIONS

McGinniss, Vincent D., "Radiation Curing: 6. Curing with Ultraviolet, Visible and Infrared Processing Equipment" from Kirk-Othmer Encyclopedia of Chemical Technology, copyright 1996, by John Wiley & Sons, Inc., Article Online posting date December 4, 2000.

(Continued)

*Primary Examiner*—Richard L. Schilling
(74) *Attorney, Agent, or Firm*—Sughrue Mion, PLLC

(57) ABSTRACT

A planographic printing plate precursor including: a support; and an image recording layer which is disposed on the support and contains a binder polymer, a polymerization initiator, a polymerizable compound, and an IR absorber. Upon exposure with a laser beam, an exposed portion of the image recording layer in the vicinity of the surface of the image recording layer is cured, and an exposed portion of the image recording layer in the vicinity of an interface between the image recording layer and the support is not cured. A developing rate of an unexposed portion of the image recording layer by an alkaline developer having a pH of 10 to 13.5 is preferably 100 nm/sec or more, and a permeation rate of the alkaline developer to an exposed portion of the image recording layer is preferably 100 nF/sec or less.

19 Claims, 2 Drawing Sheets

U.S. PATENT DOCUMENTS

| | | | | |
|---|---|---|---|---|
| 2004/0063064 | A1* | 4/2004 | Goto | 430/281.1 |
| 2004/0068026 | A1 | 4/2004 | Kunita et al. | |
| 2004/0072101 | A1* | 4/2004 | Sugasaki et al. | 430/281.1 |
| 2004/0170920 | A1 | 9/2004 | Goto | |
| 2004/0202957 | A1 | 10/2004 | Murota | |
| 2004/0234893 | A9 | 11/2004 | Fujimaki et al. | |
| 2004/0244619 | A1 | 12/2004 | Goto | |
| 2005/0037282 | A1 | 2/2005 | Sonokawa | |

FOREIGN PATENT DOCUMENTS

| | | | |
|---|---|---|---|
| EP | 0 377 321 A2 | | 7/1990 |
| EP | 0 684 522 A1 | | 11/1995 |
| EP | 0 779 161 A1 | | 6/1997 |
| EP | 0779161 | | 6/1997 |
| EP | 0 950 518 A1 | | 1/1999 |
| EP | 0950517 | | 2/1999 |
| EP | 0 919 870 A1 | | 6/1999 |
| EP | 0 950 517 A1 | | 10/1999 |
| EP | 0950518 | | 10/1999 |
| EP | 1 033 624 A1 | | 9/2000 |
| EP | 1 110 747 A1 | | 6/2001 |
| EP | 1176467 A | | 7/2001 |
| EP | 1 160 095 A2 | | 12/2001 |
| EP | 1 176 467 A1 | * | 2/2002 |
| EP | 1 182 033 A1 | | 2/2002 |
| EP | 1182032 A | | 2/2002 |
| EP | 1 186 407 A1 | | 3/2002 |
| EP | 1 216 830 A2 | | 6/2002 |
| EP | 1 219 464 A2 | | 7/2002 |
| EP | 1 235 107 A1 | | 8/2002 |
| EP | 1 241 002 A2 | | 9/2002 |
| EP | 1 245 405 A2 | | 10/2002 |
| EP | 1 249 343 A2 | | 10/2002 |
| EP | 1 249 731 A2 | | 10/2002 |
| EP | 1 332 870 A2 | | 8/2003 |
| EP | 1 338 921 A2 | | 8/2003 |
| EP | 1 341 040 A1 | | 9/2003 |
| EP | 1369231 A2 | | 12/2003 |
| EP | 1369231 AA2 | | 12/2003 |
| EP | 1 400 851 A2 | | 3/2004 |
| EP | 1 449 650 A2 | | 8/2004 |
| EP | 1 450 207 A1 | | 8/2004 |
| GB | 1 521 372 | | 8/1978 |
| JP | 54-92723 | | 7/1979 |
| JP | 54-92723 A | | 7/1979 |
| JP | 54-25957 | | 8/1979 |
| JP | 54-25957 B2 | | 8/1979 |
| JP | 54-34327 | | 10/1979 |
| JP | 54-34327 B2 | | 10/1979 |
| JP | 58-29803 | | 2/1983 |
| JP | 58-12577 | | 3/1983 |
| JP | 58-12577 B2 | | 3/1983 |
| JP | 58-134629 | * | 8/1983 |
| JP | 59-044615 | | 3/1984 |
| JP | 59-044615 A | | 3/1984 |
| JP | 59 053836 | | 3/1984 |
| JP | 59-53836 A | | 3/1984 |
| JP | 59-071048 | | 4/1984 |
| JP | 59-071048 A | | 4/1984 |
| JP | 161442 | | 6/1990 |
| JP | 4 31863 | | 2/1992 |
| JP | 4 106548 | | 4/1992 |
| JP | 7-20629 A | | 11/1994 |
| JP | 7-271029 A | | 9/1995 |
| JP | 8-108621 | | 4/1996 |
| JP | 2712564 | | 10/1997 |
| JP | 10 195119 | | 7/1998 |
| JP | 11 258801 | | 9/1999 |
| JP | 2000 131837 A | | 5/2000 |
| JP | 2000-267265 A | | 9/2000 |
| JP | 2002-040652 | | 2/2002 |
| JP | 2002-072462 A | | 3/2002 |
| WO | WO 00/48836 | | 8/2000 |

OTHER PUBLICATIONS

SR-295, product bulletin, SARTOMER Company, Exton, PA, one page, dated Nov. 1998 from internet through Sartomer web site.
SR-399, Product bulletin, SARTOMER Company, Exton, PA., one page, dated Nov. 1998, from internet through Sartomer web site.
SR-492, product bulletin, SARTOMER Company, Exton, PA on page, dated Nov. 1998 from internet through Sartomer web site.
CD-501, product bulletin, SARTOMER Company, Exton, PA, one page, dated May 1999 from internet through Sartomer web site.
SR-368, product bulletin, SARTOMER Company, Exton, PA 1 pate, dated Nov. 1998, from internet through Sartomer web site.
Product Data, Scripset 550 Styrene Maleic Anhydride Copolymer Solid, Hercules Incorporated, copyright 1999, dated Jun. 2000 from internet.
European Search Report dated Jul. 2, 2002.
European Search Report dated Apr. 16, 2004.
European Search Report dated Jun. 14, 2005.
European Search Report dated Jan. 16, 2004.
Jerry March: "Advanced organic chemistry: reactions, mechanisms, and structure" 1992, Wiley-Interscient, 4$^{th}$ Ed., USA, XP 002275533 p. 280, Table 9.4.
ben-zyl from The American Heritage dictionary of the English Language, Fourth Edition, copyright 2000 by Houghton Mifflin Company found at yourdictionary.com, one page.
Mineo et al, 08062834, English Abstract of Japanese Published Application 08062834 dated Mar. 8, 1996, p. Patent Abstracts of Japan dated 1996.
Office Action dated Jan. 31, 2005 from 10/673,332.
Office Action dated Jan. 25, 2005 from 10/673,332.
Office Action dated Apr. 18, 2005 from 10/781,922.
Office Action dated Feb. 23, 2005 from 10/669,696.
Office Action dated Apr. 18, 2005 from 10/781,645.
Office Action dated Apr. 18, 2005 from 10/782,852.
Registry No. 2154-56-5, one page "benzyl".
Patent Abstracts of Japan for Publication No. 0806283.
European Search report dated Nov. 3, 2005 for EPA No. 03022136.0.
European Search report dated Nov. 8, 2005 for EPA No. 03022140.2.

* cited by examiner

PLANOGRAPHIC PRINTING PLATE PRECURSOR

CROSS-REFERENCE TO RELATED APPLICATION

This application claims priority under 35USC 119 from Japanese Patent Application No. 2002-287819, the disclosure of which is incorporated by reference herein.

BACKGROUND OF THE INVENTION

1. Field of the Invention

The present invention relates to a negative-type planographic printing plate precursor which can be formed into a printing plate by a direct plate-making process using an infrared laser or the like based on digital signals of a computer, etc., i.e., so-called Computer-to-Plate (CTP) process.

2. Description of the Related Art

In recent years, lasers have been developed remarkably, and high-power small-size lasers are widely available. These lasers are very useful as a recording light source to be used for a direct printing plate-making (Computer-to-Plate: hereinafter, referred to as CTP) based on digital data from a computer or the like. In particular, a solid state laser and a semiconductor laser that emit infrared rays having wavelengths in a range of 760 nm to 1200 nm are particularly useful because of higher power in comparison with other wave-length ranges. Recently, there have been strong demands for an image-recording material having high sensitivity to an infrared laser, that is, an image-recording material whose solubility to a developer changes greatly upon irradiation with an infrared laser.

With respect to a negative-type image recording layer used in such a planographic printing plate precursor, public attention has been focused on those image recording layers in which, upon exposure, active species are generated in the image recording layer and the function thereof causes a physical or chemical change to make only the exposed portion insoluble so that the image recording layer at the unexposed portion is removed through the successive developing process to prepare a planographic printing plate. Among these, an image recording layer containing a light-to-heat conversion agent such as an IR absorber, a polymerization initiator that generates active species upon being heated by the light-to-heat conversion agent, a polymerizable compound such as an addition polymerizable ethylenic unsaturated compound that is subjected to a curing reaction by the active species, and further a binder polymer soluble to an alkaline developer are considered to be preferably used from the viewpoints of superior productivity and easiness in developing process.

Conventionally, with respect to the binder polymer constituting the photosensitive layer, organic high polymers capable of alkali developing, such as a methacrylic acid copolymer, an acrylic acid copolymer, an itaconic acid copolymer, a crotonic acid copolymer, a maleic acid copolymer and a partially esterified maleic acid copolymer, have been used (for example, see Japanese Patent Application Laid-Open (JP-A) No. 59-44615, Japanese Patent Application Publication (JP-B) Nos. 54-34327, 58-12577, 54-25957, JP-A Nos. 54-92723, 59-53836 and 59-71048).

However, in the case of a conventional planographic printing plate precursor having an image recording layer containing such a binder polymer, in the image area cured by exposure, there is an insufficiently cured area to which the developer permeates, resulting in problems of defective image portions and degradation in the printing press life.

In an attempt to prevent these problems, when a compound for suppressing permeability of the developer to the image area is added, the permeability of the developer to the non-image area is lowered to cause degradation in the developing property, with the result that stains tend to occur due to residual films in the non-image area. Consequently, it is very difficult to satisfy both the suppression of permeation of the developer in the image area and the high developing property in the non-image area.

SUMMARY OF THE INVENTION

This present invention has been devised to solve the above-mentioned problems. An object of the invention is to provide a planographic printing plate precursor which allows a direct-recording process by an infrared laser based on digital data from a computer or the like, and which is superior in the printing press life and image-forming properties, and which provides high quality images.

The present inventors made intensive investigations in order to achieve the above-mentioned object. They have found that the object is achieved by an image recording layer which, in an image area of the image recording layer, has a superior curing property in the vicinity of the surface while the curing property is not exerted in the vicinity of the support, to thereby accomplish the invention.

In other words, the planographic printing plate precursor of the invention is characterized by containing a support and an image recording layer disposed on the support, the image recording layer including a binder polymer, a polymerization initiator, a polymerizable compound, and an IR absorber, wherein upon exposure with a laser beam a portion of the image recording layer in the vicinity of an interface to the support is not cured at an exposed area.

With respect to such an image recording layer, a more specific embodiment may be a two-layer structure having a first layer containing a binder polymer and a second layer containing a binder polymer, a polymerization initiator, a polymerizable compound and an IR absorber. The developing rate of an unexposed portion by an alkaline developer having a pH of 10 to 13.5 is preferably 100 nm/second or more and a permeation rate of the alkaline developer to an exposed portion is 100 nF/second or less.

Here, the developing rate by the alkaline developer having a pH of 10 to 13.5 refers to a value obtained by dividing a film thickness (nm) of a recording layer by time (sec) required for the developing process. The permeation rate of the alkaline developer refers to a value that represents the rate of a change in electrostatic capacity (F) when the recording layer is formed on a conductive support, and dipped in the developer.

Although the specific mechanism by which the invention functions is unclear, it is presumed that in the planographic printing plate precursor of the invention, an efficient curing reaction progresses in the vicinity of the surface in an exposed area, making it possible to suppress permeation of the developer and consequently to prevent degradation in press life.

Moreover, in an embodiment of the invention, an image recording layer contains a support, a second layer and a first layer. The second layer, which is formed in the vicinity of the surface, contains a polymerizable compound, an IR absorber, and the like, and exerts a high image-forming property. The first layer, which is disposed between the second layer and the support, contains a binder polymer. The developing rate with respect to the recording layer as a whole and the permeation rate of the developer are controlled to the above-mentioned predetermined ranges. Therefore, at an exposed area, since the second layer is located in the vicinity of the exposed surface and since the first layer serves as a heat-insulating layer to prevent heat diffusion to the support, a curing reaction progresses sufficiently, thereby making it possible to form an image area having high strength. Moreover, since this area has a high alkali resistant property so as to protect the first layer that constitutes a lower layer, the first layer is less susceptible to damage due to the developer, thereby making it possible to maintain sufficient printing press life.

Furthermore, at an unexposed area, the second layer is uncured, and the first layer that is successively exposed is mainly composed of the binder polymer. Therefore, the image recording layer as a whole has a predetermined high developing rate, and it is possible to easily remove the image recording layer at the unexposed area by an alkaline developer and to expose a hydrophilic support surface, so as to thereby prevent generation of stains due to residual films at the non-image area. It is conquered that these effects make it possible to form high-quality images that have superior discrimination.

DETAILED DESCRIPTION OF THE INVENTION

Figure 1:
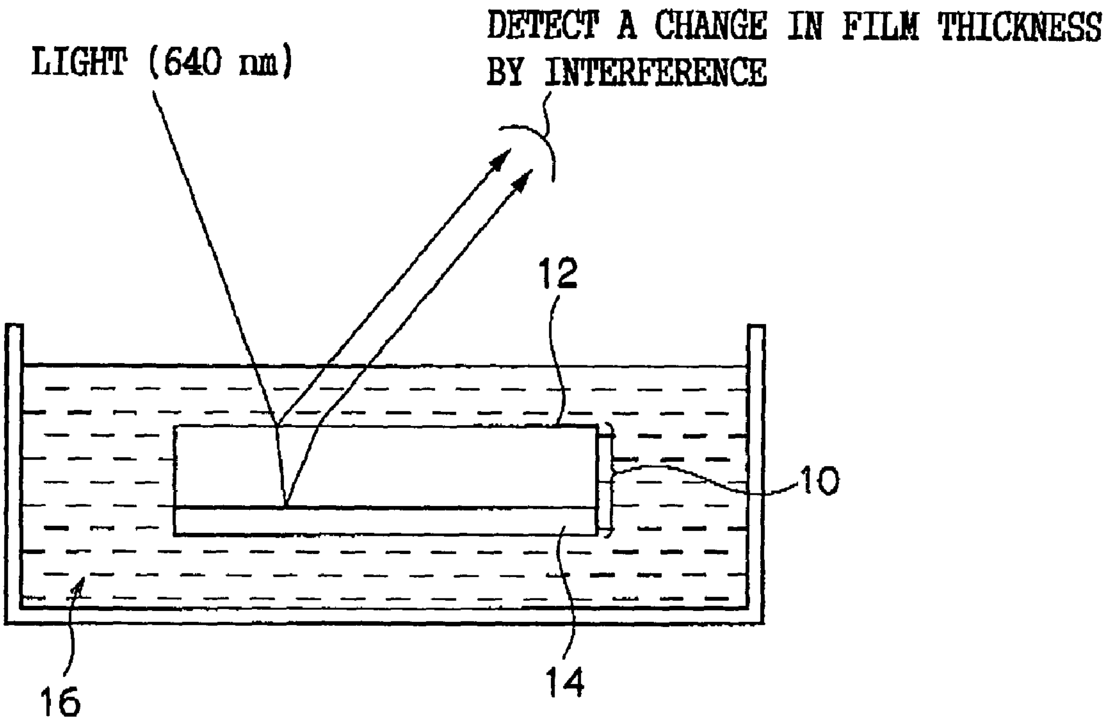
FIG. 1 is a schematic diagram that shows one example of a DRM interference wave measuring device used for measuring the dissolving behavior of an image recording layer.

A layer structure of a planographic printing plate precursor of the present invention will be described below.

The planographic printing plate precursor of the invention is characterized by an image recording layer which is disposed on a support and contains a binder polymer, a polymerization initiator, a polymerizable compound and an JR absorber, and in this image recording layer, upon exposure with a laser beam, a portion in the vicinity of an interface between the image recording layer and the support is not cured at an exposed area. In such an image recording layer, a single-layer structure may be adopted in which only the surface is cured rapidly while deeper portions are not cured. Alternatively, an image recording layer having a multiple-layer structure including two or more layers that have different curing properties may be adopted.

The state in which only the surface of the image recording layer is cured and a portion in the vicinity of the interface between the image recording layer and the support is not cured can be confirmed by observing a cross-section of the image recording layer by using a scanning electronic microscope (SEM) after exposure and developing.

More specifically, the image recording layer is cut at a particular portion, and the cut face is observed using an SEM. An SEM image shows voids formed, between the cured portions of the image recording layer in the vicinity of the surface and the support, by uncured portions deep in the image recording layer being removed by the developer. The existence of these voids confirms the fact that the deep portions in the image recording layer are uncured.

An embodiment of the invention provides an image recording layer having a two-layer structure including a first layer containing a binder polymer and a second layer containing a binder polymer, a polymerization initiator, a polymerizable compound and an IR absorber, and in the unexposed portion of the image recording layer, the developing rate of an unexposed portion by an alkaline developer having a pH of 10 to 13.5 is preferably 100 nm/second or more and a permeation rate of the alkaline developer to an exposed portion is 100 nF/second or less.

The following description will discuss the invention in more detail by exemplifying an image recording layer having such a two-layer structure.

[First Layer Containing a Binder Polymer]

The planographic printing plate precursor of the invention is preferably provided with at least two layers formed on a support, and a first layer (hereinafter, sometimes referred to as a lower layer) containing a binder polymer is placed at a position close to the support.

(Binder Polymer)

First, the following description will discuss the binder polymer that features the lower layer.

Any material may be used as the material for the binder polymer, as long as it is capable to form a film, and it contains, in its molecule, an alkali-soluble group that enables the binder to dissolve in an alkaline developer and a functional group, e.g. a hydrophobic group, that prevents the developer from permeating to the film to be formed. Examples of the binder polymer having such a partial structure include a linear organic high polymer having a structural unit represented by the following general formula (I):

General formula (I)

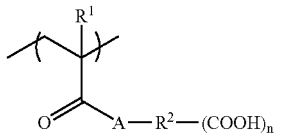

In general formula (I), $R^1$ represents a hydrogen atom or a methyl group. $R^2$ represents an (n+1) valent substituted or unsubstituted hydrocarbon group that has an alicyclic structure having 3 to 30 carbon atoms, and one or more carbon atoms of $R^2$ may be replaced by an oxygen atom or a nitrogen atom. A represents an oxygen atom or a $NR^3$ group [$R^3$ represents a hydrogen atom or a monovalent hydrocarbon group having 1 to 10 carbon atoms which may have a substituent]. n represents an integer from 1 to 5.

Additionally, in the present specification, when either acrylic acid or methacrylic acid or both of them is referred to, it is sometimes referred to as (meth)acrylic acid.

In the binder polymer having a structural unit represented by the general formula (I), a (meth)acrylic acid ester, which simultaneously has a carboxyl group and an alicyclic hydrocarbon structure, exists as a copolymer component that exerts an alkali developing property. In accordance with this structure, an alicyclic hydrocarbon structure having a high hydrophobic property is introduced to the vicinity of a carboxylic acid, and it is considered that this hydrophobic surface characteristic effectively suppresses permeation of a developer into a film.

In general formula (I), $R^2$ represents an (n+1) valent hydrocarbon group that has an alicyclic structure with 3 to 30 carbon atoms. This hydrocarbon group may have one or more substituents, and the number of carbon atoms thereof including an optional substituent should be 3 to 30.

With respect to the (n+1) valent hydrocarbon group having such an alicyclic structure, examples thereof include the following compounds which may have one or more optional substituent(s), that is, those compounds having an alicyclic structure from which (n+1) number of hydrogen atoms on arbitrary carbon atoms constituting each compound are removed to form (n+1) valent hydrocarbon groups, such as cyclopropane, cyclopentane, cyclohexane, cycloheptane, cyclooctane, cyclodecane, dicyclohexyl, tercyclohexyl, norbornane, decahydro naphthalene, perhydrofluorene, tricyclo[5.2.1.0$^{2,6}$]decane, adamantane, quadricyclane, conglessan, Cubane, spiro[4.4]octane, cyclopentene, cyclohexane, cycloheptene, cyclooctene, cyclodecene, cyclohexadiene, cycloheptadiene, cyclooctadiene, cycloheptatriene, cyclodecatriene, cyclooctatetraene, norbornylene, octahydronaphthalene, bicycle[2.2.1]heptadiene, bicyclo[4.3.0]nonadiene, dicyclopentadiene, hexahydroanthracene and spiro[4.5]decadiene.

One or more of arbitrary carbon atoms of a compound constituting an alicyclic structure of $R^2$ may be replaced by a hetero atom selected from the group consisting of a nitrogen atom, an oxygen atom and a sulfur atom. From the viewpoint of improving printing press life, $R^2$ is an (n+1) valent substituted or unsubstituted hydrocarbon group, which has 5 to 30 carbon atoms, and/ore preferably 5 to 15 carbon atoms, and which has an alicyclic structure that contains two or more rings. Examples thereof include a condensed polycyclic aliphatic hydrocarbon, a crosslinking alicyclic hydrocarbon, a spiro aliphatic hydrocarbon and an aggregation of aliphatic hydrocarbon rings. In this case also, the number of carbon atoms includes carbon atoms of a substituent.

With respect to the substituent that is applicable to $R^2$, examples thereof include monovalent nonmetal atomic groups except for hydrogen, and preferable examples are: halogen atoms (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkyl carbamoyloxy group, N-aryl carbamoyloxy group, N,N-dialkyl carbamoyloxy group, N,N-diaryl carbamoyloxy group, N-alkyl-N-aryl carbamoyloxy group, alkylsulfoxy group, arylsulfoxy group, acylthio group, acylamino group, N-alkylacylamino group, N-arylacylamino group, ureide group, N'-alkylureide group, N',N'-dialkylureide group, N'-arylureide group, N',N'-diarylureide group, N'-alkyl-N'-arylureide group, N-alkylureide group, N-arylureide group, N'-alkyl-N-alkylureide group, N'-alkyl-N-arylureide group, N',N'-dialkyl-N-alkylureide group, N',N'-dialkyl-N-arylureide group, N'-aryl-N-alkylureide group, N'-aryl-N-arylureide group, N',N'-diaryl-N-alkylureide group, N',N'-diaryl-N-arylureide group, N'-alkyl-N'-aryl-N-alkylureide group, N'-alkyl-N'-aryl-N-arylureide group, alkoxycarbonyl amino group, aryloxycarbonyl amino group, N-alkyl-N-alkoxycarbonyl amino group, N-alkyl-N-aryloxycarbonyl amino group, N-aryl-N-alkoxycarbonyl amino group, N-aryl-N-aryloxycarbonyl amino group, formyl group, acyl group, carboxyl group and its conjugate base group (hereinafter, referred to as carboxylate), alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkyl sulfinyl group, aryl sulfinyl group, alkyl sulfinyl group, aryl sulfinyl group, sulfo group (—$SO_3H$) and its conjugate base group (hereinafter, referred to as sulfonate group), alkoxy sulfonyl group, aryloxy sulfonyl group, sulfinamoyl group, N-alkyl sulfinamoyl group, N,N-dialkyl sulfinamoyl group, N-aryl sulfinamoyl group, N,N-diaryl sulfinamoyl group, N-alkyl-N-aryl sulfinamoyl group, sulfamoyl group, N-alkyl sulfamoyl group, N,N-dialkyl sulfamoyl group, N-aryl sulfamoyl group, N,N-diaryl sulfamoyl group, N-alkyl-N-aryl sulfamoyl group, N-acyl sulfamoyl group and its conjugate base group, N-alkyl sulfonyl sulfamoyl group, (—$SO_2NHSO_2$(alkyl)) and its conjugate base group, N-aryl sulfonyl sulfamoyl group (—$SO_2NHSO_2$(aryl)) and its conjugate base group, N-alkyl sulfonyl carbamoyl group (—$CONHSO_2$(alkyl)) and its conjugate base group, N-aryl sulfonyl carbamoyl group (—$CONHSO_2$(aryl)) and its conjugate base group, alkoxy silyl group (—$Si(Oalkyl)_3$), aryloxy silyl group (—$Si(Oalkyl)_3$), hydroxy silyl group (—$Si(OH)_3$) and its conjugate base group, phosphono group (—$PO_3H_2$) and its conjugate base group (hereinafter, referred to as phosphonate group), dialkyl phosphono group (—$PO_3(alkyl)_2$), diaryl phosphono group (—$PO_3(aryl)_2$), alkyl aryl phosphono group (—$PO_3$(alkyl)(aryl)), monoalkyl phosphono group (—$PO_3H$(alkyl)) and its conjugate base group (hereinafter, referred to as alkyl phosphonate group), monoaryl phosphono group (—$PO_3H$(aryl)) and its conjugate base group (hereinafter, referred to as aryl phosphonate group), phosphonooxy group (—$OPO_3H_2$) and its conjugate base group (hereinafter, referred to as phosphonatoxy group), dialkyl phosphonooxy group (—$OPO_3(alkyl)_2$), diaryl phosphonooxy group (—$OPO_3(aryl)_2$), alkyl aryl phosphonooxy group (—$OPO_3$(alkyl)(aryl)), monoalkyl phosphonooxy group (—$OPO_3H$(alkyl)) and its conjugate base group (hereinafter, referred to as alkyl phosphonatoxy group), monoaryl phosphonooxy group (—$OPO_3H$(aryl)) and its conjugate base group (hereinafter, referred to as aryl phosphonatoxy group), cyano group, nitro group, dialkyl boryl group (—$B(alkyl)_2$), diaryl boryl group (—$B(aryl)_2$), alkyl aryl boryl group (—B(alkyl)(aryl)), dihydroxy boryl group (—$B(OH)_2$) and its conjugate base group, alkylhydroxy boryl group (—B(alkyl)(OH)) and its conjugate base group, arylhydroxy boryl group (—B(aryl)(OH)) and its conjugate base, aryl group, alkenyl group and alkynyl group.

Although it depends on a purpose, a substituent having a hydrogen atom capable of hydrogen-bonding, in particular, a substituent that is acidic with an acid dissociation constant (pKa) smaller than that of carboxylic acid. Such a substituent tends to reduce the suppressing effects of developer permeation; therefore, it is preferable not to use the substituent of this type. In contrast, halogen atoms and hydrophobic substituents, such as hydrocarbon groups (alkyl group, aryl group, alkenyl group, alkynyl group, etc.), alkoxy group and aryloxy group, are useful for providing permeation-suppressing effects as described above. Thus, these are preferably used, and such a hydrophobic substituent is preferably included therein particularly in the case of a single-ring aliphatic hydrocarbon having 6 or less-membered ring, such as cyclopentane and cyclohexane. These substituents may possibly be bonded to each other or bonded with the substituted hydrocarbon group to form a ring, or the substituents may be further substituted. Most preferably, A is $NR^3$, and $R^2$ is a single-ring aliphatic hydrocarbon having 6 or less-membered ring which may have a substituent having 5 to 15 carbon atoms.

In general formula (I), A represents an oxygen atom or $NR^3$ [$R^3$ is a hydrogen atom or a monovalent hydrocarbon group having 1 to 10 carbon atoms that may have a substituent].

Here, with respect to the monovalent hydrocarbon group, which is represented by $R^3$, having 1 to 10 carbon atoms, examples thereof include alkyl group, aryl group, alkenyl group and alkynyl group. Specific examples of the alkyl group includes straight chain, branched chain, or cyclic alkyl groups having 1 to 10 carbon atoms, such as methyl group, ethyl group, propyl group, butyl group, pentyl group, hexyl group, heptyl group, octyl group, nonyl group, decyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclopentyl group, cyclohexyl group, 1-adamantyl group and 2-norbornyl group. Specific examples of the aryl group includes: aryl groups having carbon atoms of 1 to 10, such as phenyl group, naphthyl group and indenyl group, heteroaryl groups having 1 to 10 carbon atoms, which contains one heteroatom selected from the group consisting of a nitrogen atom, an oxygen atom and a sulfur atom, such as furyl group, thienyl group, pyrrolyl group, pyridyl group and quinolyl group. Specific examples of the alkynyl group include: straight chain, branched chain, or cyclic alkenyl groups having 1 to 10 carbon atoms, such as vinyl group, 1-propenyl group, 1-butenyl group, 1-methyl-1-propenyl group, 1-cyclopentenyl group and 1-cyclohexenyl group. Specific examples of the alkynyl group include: alkynyl groups having 1 to 10 carbon atoms such as ethynyl group, 1-propenyl group, 1-butynyl group and octynyl group. With respect to the substituent that can be incorporated in $R^3$, the same substituents as those exemplified in $R^2$ may be used. Here, the number of carbon atoms of $R^3$ needs to be 1 to 10, including-carbon atoms of substituents.

From the viewpoint of easiness in the synthesizing process, A is preferably an oxygen atom or an NH group. Here, n is an integer from 1 to 5. From the viewpoint of improving printing press life, it is preferably 1.

Specific examples of a preferable repeating structural unit represented by general formula (I) include the following formulas; however, these examples should not be construed to limit the scope of the invention.

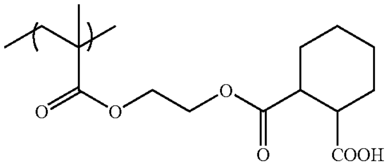
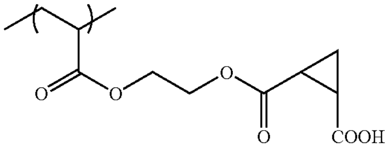
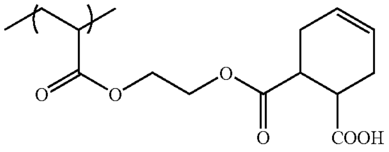
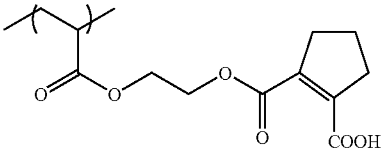
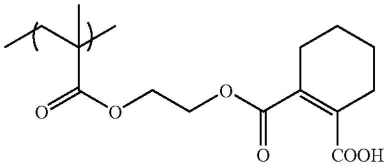
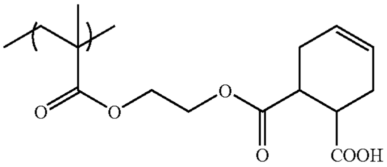
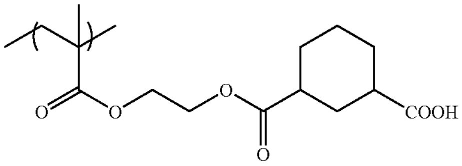
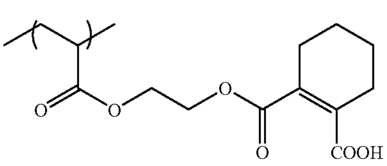
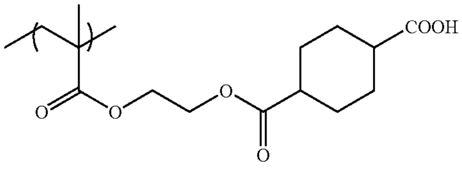
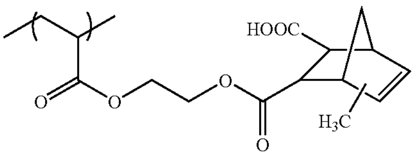
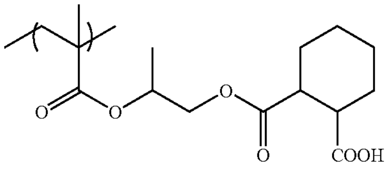
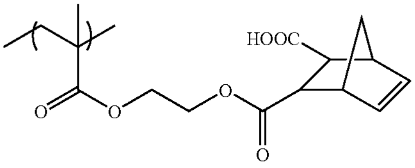

-continued
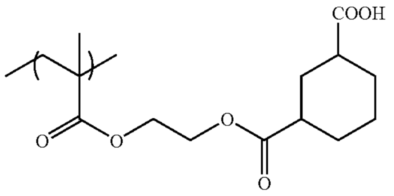
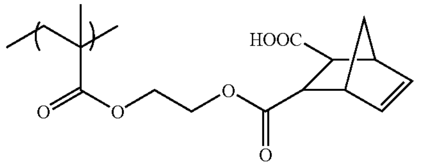
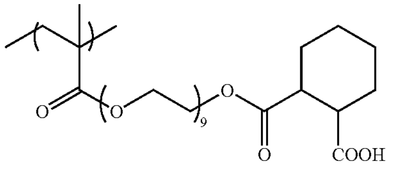
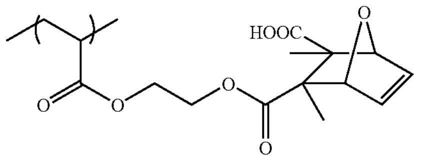
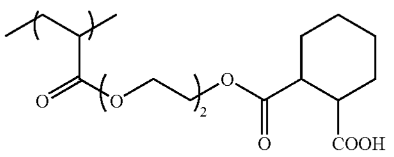
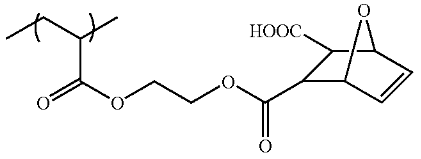
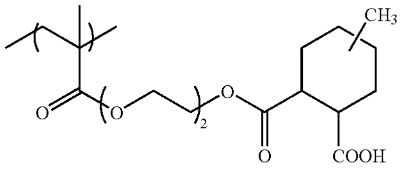
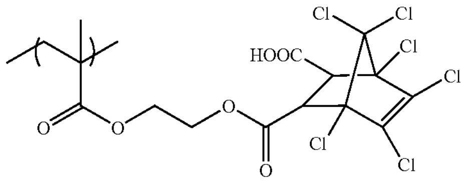
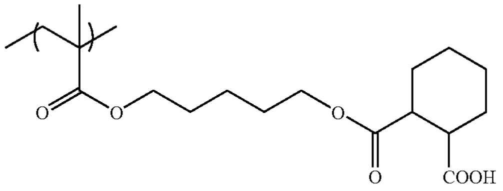
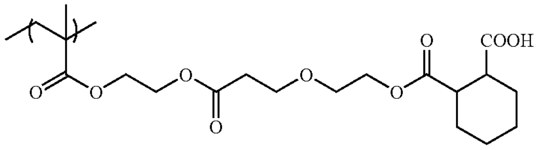
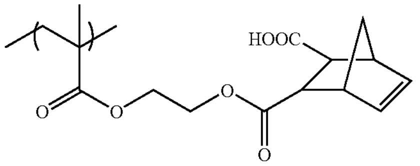
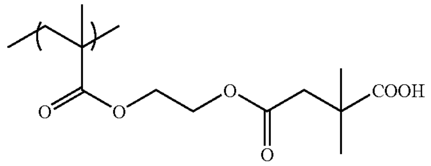
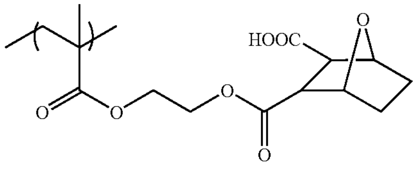
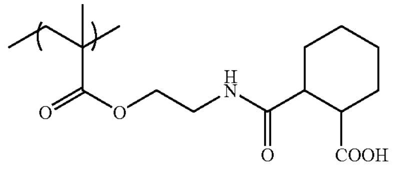
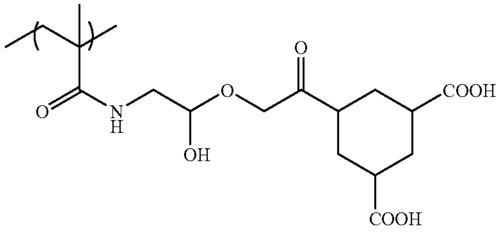
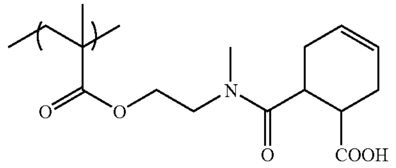
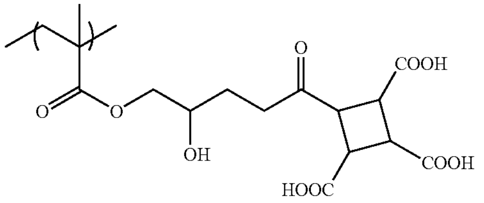
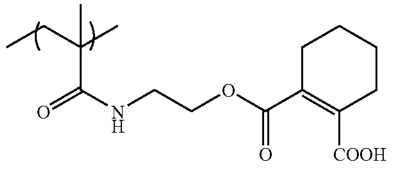

-continued
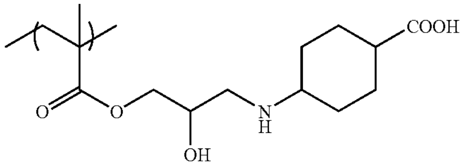
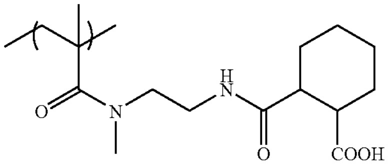
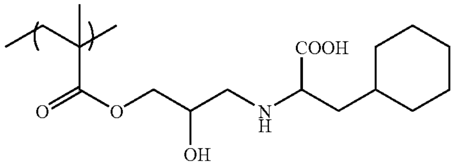
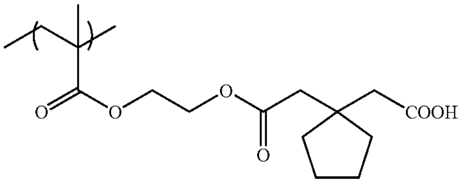
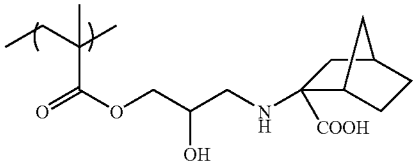
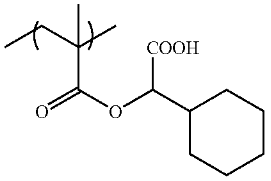
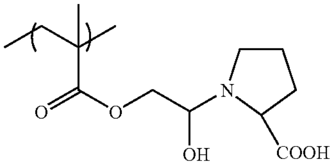
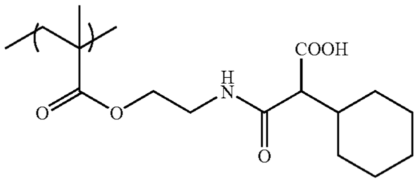
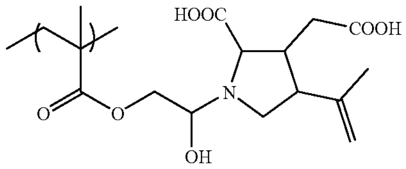
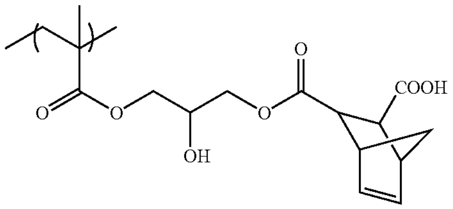
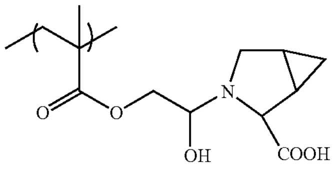
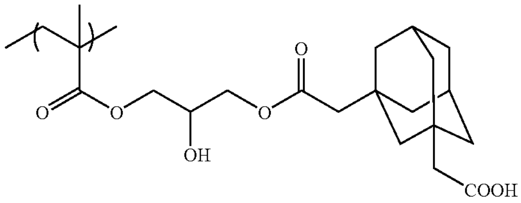
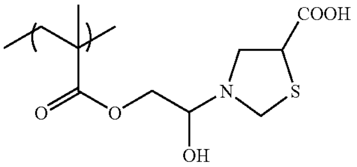
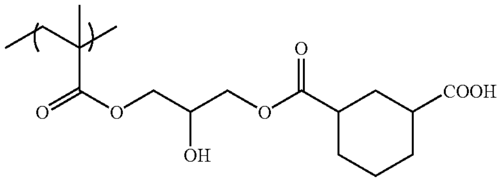
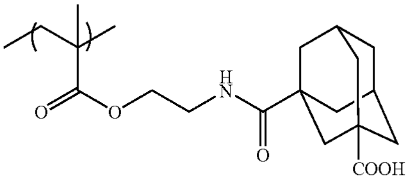
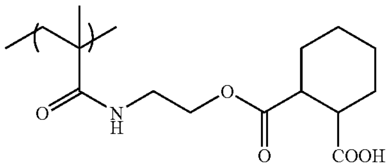
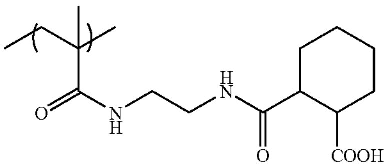
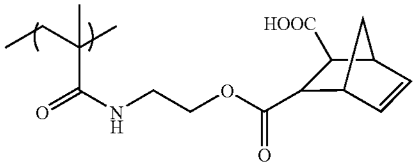
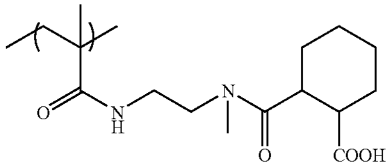

-continued
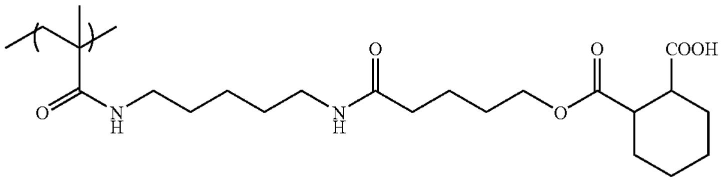
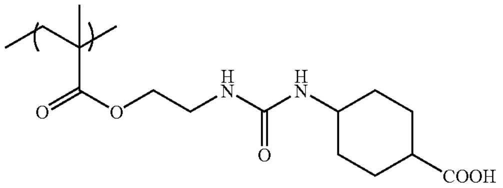
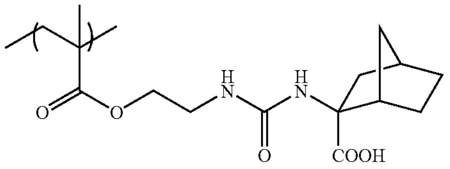
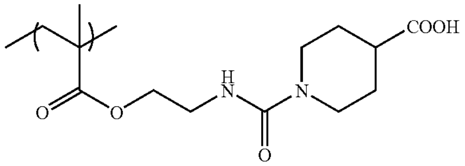
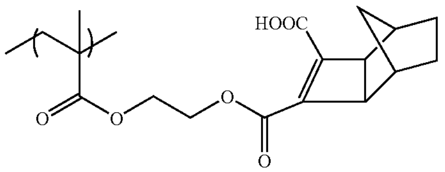
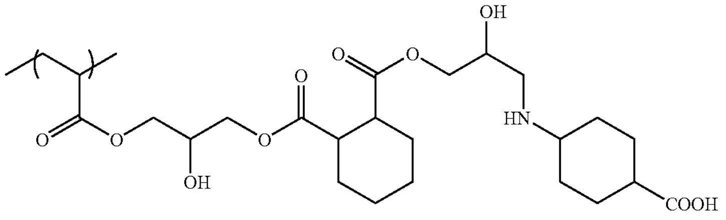
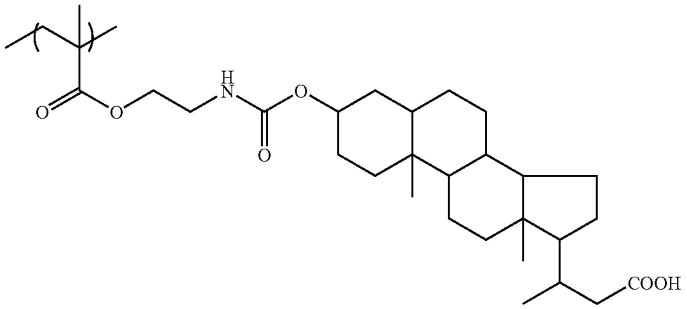
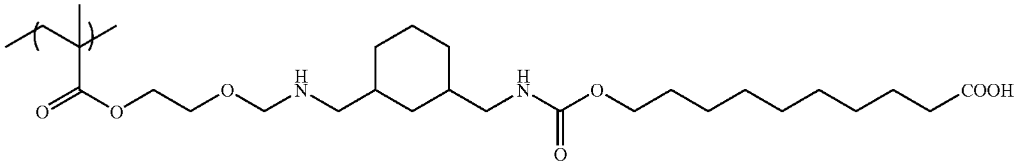
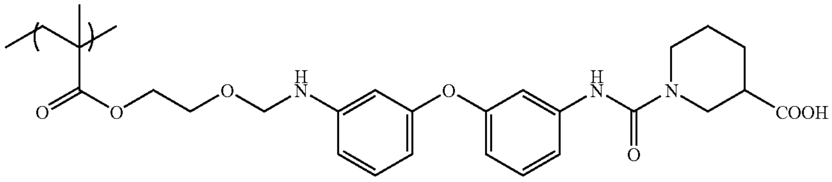
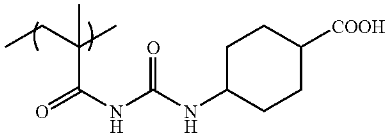
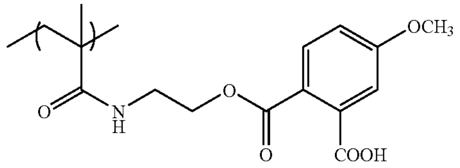

-continued

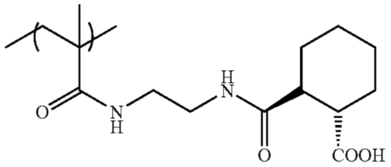

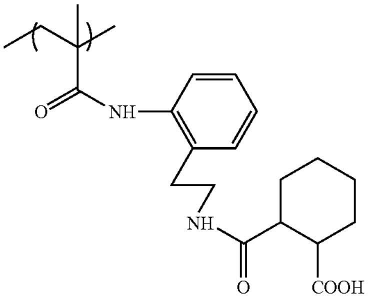

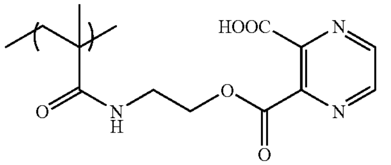

With respect to the repeating structural unit represented by general formula (I), only one kind thereof may be contained in a binder polymer, or two or more kinds thereof may be contained therein.

The binder polymer in the invention may be a polymer composed of only the repeating structural unit represented by general formula (I). However, it may be combined with other copolymer components, and used as a copolymer. The total content of the repeating structural unit represented by general formula (I) in the copolymer is appropriately determined depending on its structure, preferable characteristics of the lower layer and the like. Preferably, it is contained in a range of 1 to 99% by mol, more preferably 10 to 70% by mol, and most preferably 20 to 50% by mol with respect to the total mol of the polymer components.

With respect to the copolymer component when a repeating unit represented by general formula (1) is used in a copolymer, conventionally known monomers may be used without limitation as long as they are capable of radical polymerization. Specific examples thereof include monomers described in "Polymer Data Handbook—Primary Edition—, (compiled by Konbunshi Gakkai, Baifukan (1986)". Only one kind of these copolymer components may be used, or two kinds or more of these may be used in combination.

The molecular weight of the binder polymer of the invention is appropriately determined by taking both of the solubility to a developer and permeation-suppressing effect into consideration. Normally, as the molecular weight becomes higher, the solubility to the developer tends to drop although the permeation-suppressing effect is improved. In contrast, when the molecular weight is low, the permeation-suppressing effect is lowered, although the solubility is improved.

The molecular weight is preferably 2,000 to 1,000,000, more preferably 5,000 to 500,000, and most preferably 10,000 to 200,000.

When a lower layer is formed by using this binder polymer, it may be formed by using only the binder polymer having the structural unit represented by general formula (I), or one or more kinds of other binder polymers may be used in combination to provide a mixture, as long as the effects of the invention are not impaired. With respect to the binder polymer to be used in combination, the content thereof is preferably 1 to 60% by weight, more preferably 1 to 40% by weight, and most preferably 1 to 20% by weight, with respect to the total weight of the binder polymer components. With respect to the binder polymer to be used in combination, conventionally known polymers may be used without limitation, and more specifically, preferable examples include acrylic main-chain binders, urethane binders and the like, which are often used in the present industrial field.

The total amount of the binder polymer having the structural unit represented by general formula (I) and a binder polymer to be used in combination in the lower layer may be appropriately determined, and is normally 10 to 90% by weight, more preferably 20 to 80% by weight, and most preferably 30 to 70% by weight, with respect to the entire solid components in the lower layer.

Moreover, the acid value (meq/g) of the binder polymer is preferably in a range of 2.00 to 3.60.

Upon forming the lower layer on a support, components of the lower layer including this binder polymer may be dissolved in any of various organic solvents, and applied thereon.

With respect to the solvent to be used, dimethyl acetamide or the like is preferably used.

An amount of coating of the lower layer is appropriately determined in accordance with desired characteristics of the planographic printing plate precursor, but in general, the amount of coating thereof is preferably about the same as that of the second layer, which will be described later.

When the amount of coating is too large, the adhesiveness to the substrate is reduced, failing to obtain sufficient suppressing effects against degradation in the printing press life. When the amount of coating is too small, it is not possible to obtain sufficient effects derived from a multilayer structure. In general, the coating amount after drying is preferably 0.01 to 1.5 μg/m, more preferably 0.05 to 1.0 μm, and most preferably 0.1 to 0.8 μm.

[Second Layer Containing Binder Polymer, Polymerization Initiator, Polymerizable Compound and IR Absorber]

In the planographic printing plate precursor of this invention, a second layer (hereinafter, sometimes referred to as an upper layer) having an image-forming function is placed on the upper side of the above-mentioned lower layer.

The following description will discuss components to be contained in this upper layer. With respect to a composition used for an image-forming process, which is used as a recording layer of the planographic printing plate precursor of the invention, conventionally known negative-type photosensitive materials may be used. With respect to the negative-type photosensitive material, preferable examples include a combination between a compound (a polymerization initiator) that generates a radical due to light or heat and a polymerizable compound having an ethylenic unsaturated bond that can be radical addition polymerized, and the like.

The planographic printing plate precursor of the invention is preferably applied to a plate-forming process in which a laser beam having a wavelength of 300 to 1,200 nm is used for directly drawing patterns. In comparison with a conventional planographic printing plate, this printing plate precursor is superior in halftone reproducibility, and makes it possible to form an image with superior image quality in which high discrimination is achieved.

With respect to a particularly preferable composition used in the second layer of the planographic printing plate of the invention, examples thereof include: a composition which contains a compound (a polymerization initiator) that generates a radical due to light or heat, a polymerizable compound having an ethylenic unsaturated bond that can be radical addition polymerized and an IR absorber, and which further contains a binder polymer having a repeating structural unit represented by general formula (1) that is used in the above-mentioned lower layer, as the binder polymer used for improving film properties. In addition, various known additives, such as a co-sensitizer, a colorant, a plasticizer and a polymerization inhibitor, may be added to this upper layer, if necessary.

(Polymerizable Compound)

The polymerizable compound having at least one ethylenic unsaturated double bond, which is applied to the second layer in the invention, is selected from compounds containing at least one terminal ethylenic unsaturated bond, more preferably, two or more terminal ethylenic unsaturated bonds. A group of compounds of this type have been well known in the art, and these compounds may be applied to the invention, which should not be limited thereto. These compounds may have chemical forms such as a monomer, a prepolymer, i.e. a dimer, a trimer and an oligomer, and a mixture of these as well as a copolymer of these. With respect to the monomer and the copolymer thereof, examples thereof include: unsaturated carboxylic acid (for example, acrylic acid, methacrylic acid, itaconic acid, crotonic acid, isocrotonic acid, maleic acid and the like) and esters thereof as well as amides thereof, and preferable examples are an ester between an unsaturated carboxylic acid and an aliphatic polyhydric alcohol compound and an amide between an unsaturated carboxylic acid and an aliphatic polyhydric amine compound. Moreover, an addition reaction product between an unsaturated carboxylic acid ester or an amide having a nucleophilic substituent such as a hydroxyl group, amino group and mercapto group, and a monofunctional or polyfunctional isocyanate or epoxy, and a dehydration-condensation reaction product of such an unsaturated carboxylic acid ester and a monofunctional or multifunctional carboxylic acid, and the like, are preferably used. Furthermore, an addition reaction product between an unsaturated carboxylic acid ester having an electron-philic substituent, such as an isocyanate group or an amide group, and a monofunctional or polyfunctional alcohol, amine or thiol, and a substitution reaction product between an unsaturated carboxylic acid ester or amide having a desorptive substituent, such as a halogen group and a tosyloxy group, and a monofunctional or polyfunctional alcohol, amine or thiol are also preferably used. Here, a group of compounds in which the above-mentioned unsaturated carboxylic acid is replaced by unsaturated phosphonic acid, styrene, vinyl ether or the like may also be used.

Specific examples of the ester monomer between an aliphatic polyhydric alcohol compound and an unsaturated carboxylic acid include: acrylic acid esters such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxy propyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri (acryloyloxy ethyl) isocyanurate and polyester acrylate oligomer.

With respect to the methacrylic acid ester, examples thereof include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropyl)phenyl]dimethyl ethane and bis-[p-(methacryloxyethoxy)phenyl]dimethyl methane.

With respect to the itaconic acid ester, examples thereof include ethylene glycol diitaconate, propylene glycol diitaconate, 1,3-butane diol diitaconate, 1,4-butane diol diitaconate, tetramethylene glycol diitaconate, pentaerythritol diitaconate and sorbitol tetraitaconate. With respect to the crotonic acid ester, examples thereof include ethylene glycol dicrotonate, tetramethylene glycol dicrotonate, pentaerythritol dicrotonate and sorbitol tetradicrotonate. With respect to the isocrotonic acid ester, examples thereof include ethylene glycol diisocrotonate, pentaerythritol diisocrotonate and sorbitol tetraisocrotonate. With respect to the maleic acid ester, examples thereof include ethylene glycol dimaleate, triethylene glycol dimaleate, pentaerythritol dimaleate and sorbitol tetramaleate.

Examples of the other preferable esters include aliphatic alcohol-based esters disclosed in JP-B Nos. 46-27926, 51-47334 and JP-A No. 57-196231, those esters having an aromatic skeleton disclosed in JP-A Nos. 59-5240, 59-5241 and 2-226149, and those esters containing an amino group disclosed in JP-A No. 1-165613. Moreover, the above-mentioned ester monomers may be used as a mixture.

Moreover, specific examples of the monomer between an aliphatic polyhydric amine compound and an unsaturated carboxylic acid include: methylene bis-acrylic amide, methylene bis-methacrylic amide, 1,6-hexamethylene bis-acrylic amide, 1,6-hexamethylene bis-methacrylic acid, diethylene triamine trisquaryl amide, xylylene bis-acrylic amide and xylylene bis-methacrylic amide. Examples of the other preferable amide-based monomers include those having a cyclohexylene structure disclosed in JP-B No. 54-21726.

Furthermore, an urethane-based addition polymerizable compound prepared by utilizing an addition reaction between isocyanate and a hydroxyl group is also preferably used. Specific examples of this compound include a vinyl urethane compound and the like disclosed in JP-B No. 48-41708, which contains two or more polymerizable vinyl groups in one molecule. The vinyl urethane compound is formed by adding a hydroxyl group-containing vinyl monomer that is represented by the following general formula (II) to a polyisocyanate compound having two or more isocyanate groups in one molecule.

$CH_2{=}C(R^4)COOCH_2CH(R^5)OH$ General formula (II)

(In general formula (II), $R^4$ and $R^5$ each independently represent H or $CH_3$.)

Moreover, urethane acrylates disclosed in JP-A No. 51-37193, JP-B Nos. 2-32293 and 2-16765, and urethane compounds having an ethylene-oxide-based skeleton disclosed in JP-B Nos. 58-49860, 56-17654, 62-39417 and 62-39418 are also preferably used. Furthermore, the application of addition polymerizable compounds having an amino structure and a sulfide structure inside the molecule disclosed in JP-A Nos. 63-277653, 63-260909 and 1-105238 makes it possible to provide a photo-polymerizable composition that is superior in photosensitivity.

Examples of the other preferable compounds include polyester acrylates, polyfunctional acrylates and methacrylates, such as epoxy acrylates obtained by allowing an epoxy resin to react with (meth)acrylic acid, that are disclosed in JP-A No. 48-64183, JP-B Nos. 49-43191 and 52-30490. Further, specific unsaturated compounds, disclosed in JP-B Nos. 46-43946, 1-40337, 1-40336, and vinyl phosphoric acid-based compounds, disclosed in JP-A No. 2-25493, are also listed. Moreover, in some cases, a structure containing a perfluoroalkyl group, disclosed in JP-A No. 61-22048, may be preferably used. Furthermore, those compounds discussed as photo-curable monomers and oligomers on pages 300 to 308 in Journal of Japan Adhesive Society Vol. 20, No. 7 (1984) may also be used.

With respect to these polymerizable compounds, detailed method of using, such as the structure, i.e. which compound is used, whether such a compound is used alone or a plurality of compounds are used in combination, and how much amount is applied, can be determined in accordance with the designed performances of a finished image recording layer.

For example, the selection may be made from the following viewpoints. With respect to photosensitivity, a structure having a larger amount of unsaturated groups per molecule is preferably used, and in most cases, those of difunctional or more are preferably used. Further, in order to increase the strength of an image area, i.e. a cured film, those of trifunctional or more are preferably used. In order to adjust both the photosensitivity and strength those compounds having different number of functional groups and different polymerizable groups (for example, acrylic acid ester, methacrylic acid ester, styrene-based compounds and vinyl ether-based compounds) are effectively used. Compounds having great molecular weight and compounds having a high hydrophobic property may be superior in photosensitivity and film strength while disadvantageous for slow developing speed and occurrence of precipitation in developer. Moreover, with respect to the compatibility and dispersing property to other components in the photosensitive layer (for example, binder polymer, initiator, colorant, etc.), the selection and methods of application of addition polymerizable compounds play important roles, and, for example, the application of a low-purity compound and the application of two or more compounds in combination may improve the compatibility. In order to improve the adhesiveness to a substrate, a over-coat layer to be described later, or the like, a specific structure may be selected.

With respect to the ratio of blend of addition polymerizable compounds in an image recording layer, the larger the amount the more advantageous in sensitivity. However, the excessive amount tends to cause undesired phase separation, problems with manufacturing processes due to stickiness of the photosensitive layer (for example, defects in the product due to transferred photosensitive-layer components, stickiness thereof and the like) and problems of deposition and the like from the developer.

From these points of view, the addition polymerizable compounds are preferably used in a range of 5 to 80% by weight, more preferably, 25 to 75% by weight, with respect to non-volatile components in the photosensitive layer.

Moreover, these compounds may be used alone, or two or more of these may be used in combination. In addition, with respect to the application method of the addition polymerizable compounds, an appropriate structure, blend and amount of addition may be desirably selected from the viewpoints of the degree of polymerization inhibition due to oxygen, resolution, fogging, variations in diffraction index, surface stickiness and the like, and depending on cases, another structure and coating method may be used in which an adjacent layer such as an overcoat layer and an undercoat layer is prepared and these compounds are added to this layer, without being contained in the same image recording layer together with the other components.

(Polymerization Initiator)

With respect to a polymerization initiator for starting and carrying out a curing reaction in the above-mentioned polymerizable compound, a compound that generates an activator such as a radical due to light or heat is used. With respect to the photo-polymerization initiator, in accordance with the wavelength of a light-source to be used, selection is appropriately made from various photo-polymerization initiators that have been known in patents, documents, and the like, or from combined systems (photo-polymerization initiator system) of two or more kinds of photo-polymerization initiators, and an appropriate one is applied.

In the case of using a blue-color semiconductor laser, Ar laser, second harmonic of an infrared semiconductor laser or SHG-YG laser as the light source, various photo-polymerization initiators (systems) have been proposed. Examples thereof include a system of using a combination of a certain kind of a photoreducing dye such as Rose Bengal, cosine and erythrosine, or a dye with an initiator described in U.S. Pat. No. 2,850,445, a composite initiation system, for example, of a dye and an amine (see, JP-B No. 44-20189), a combination system of hexaarylbiimidazole, a radical generator and a dye (see, JP-B No. 45-37377), a system of hexaarylbiimidazole and p-dialkylaminobenzylidene ketone (see, JP-B No. 47-2528, JP-A No. 54-155292), a system of a cyclic cis-α-dicarbonyl compound and a dye (see, JP-A No. 48-84183), a system of a cyclic triazine and a merocyanine dye (see, JP-A No. 54-151024), a system of 3-ketocoumarin and an active agent (see, JP-A Nos. 52-112681 and 58-15503), a system of biimidazole, a styrene derivative and thiol (see, JP-A No. 59-140203), a system of an organic peroxide and a dye (see, JP-A Nos. 59-1504, 59-140203, 59-189340, 62-174203, JP-B No. 62-1641 and U.S. Pat. No. 4,766,055), a system of a dye and an active halogen compound (see, JP-A Nos. 63-1718105, 63-258903 and Japanese Patent Application No. 2-63054), a system of a dye and a borate compound (see, JP-A Nos. 62-143044, 62-150242, 64-13140, 64-13141, 64-13142, 64-13143, 64-13144, 64-17048, 1-229003, 1-298348 and 1-138204), a system of a dye having a rhodanine ring and a radical generator (see, JP-A Nos. 2-179643 and 2-244050), a system of titanocene and a 3-ketocoumarin dye (see, JP-A No. 63-221110), a system of titanocene and a xanthene dye where an addition polymerizable ethylenically unsaturated compound containing an amino group or urethane group is further combined (see, JP-A Nos. 4-221958 and 4-219756), a system of titanocene and a specific merocyanine dye (see, JP-A No. 6-295061) and a system of titanocene and a dye having a benzopyran ring (see, JP-A No. 8-334897).

In an image recording layer of the planographic printing plate of the invention, a particularly preferable photo-polymerization initiator (system) contains at least one kind of titanocene. With respect to the titanocene compound to be used as the photo-polymerization initiator (system) of the invention, any titanocene compound may be used as long as it generates an active radical upon light exposure in the coexistence with another sensitizer pigment such as an IR absorber, and selection is made from known compounds disclosed in JP-A Nos. 59-152396, 61-151197, 63-41483, 63-41484, 2-249, 2-291, 3-27393, 3-12403 and 6-41170, and an appropriate one may be used.

Specific examples thereof include: dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-T-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-yl)phenyl)titanium (hereinafter sometimes referred to as "T-2").

The titanocene compound may be subjected to various chemical modifications so as to improve the properties of the photosensitive layer. Examples of the chemical modification which can be used include the methods such as bonding with an IR absorber, a sensitizing dye, an addition polymerizable unsaturated compound or other radical-generating part, introduction of a hydrophilic site, introduction of a substituent to improve the compatibility or prevent the precipitation of crystal, introduction of a substituent capable of improving the adhesive property, and polymer formation. In the same manner as the above-described addition polymerizable compound, the use method of the titanocene compound may also be appropriately and freely selected in accordance with the performance design of the negative-type photosensitive planographic printing plate. For example, when two or more compounds are used, the compatibility with the photosensitive layer can be improved.

In general, the photo-polymerization initiator such as the titanocene compound is advantageously used in a large amount in view of the light sensitivity. A sufficient recording operation can be achieved by using it in an amount of 0.5 to 80 parts by weight, preferably from 1 to 50 parts by weight, per 100 parts of the entire solid components in the recording layer. On the other hand, in the case of application of the planographic printing plate of the invention under a yellow lamp or a white lamp, the titanocene is preferably used in a small amount in view of the fogging property due to light in the vicinity of 500 nm. However, by using titanocene in combination with other sensitizing dye, sufficiently high sensitivity can be obtained even if the amount of use thereof is reduced to 6 parts by weight or less, more reduced to 1.9 parts by weight or less, still more reduced to 1.4 parts by weight or less.

Moreover, a thermally decomposing radical generator that is decomposed due to heat to generate a radical is preferably used as the polymerization initiator of the invention. The radical generator of this type is used in combination with an IR absorber, which will be described later, so that upon irradiation with an Infrared laser beam, the IR absorber generates heat and a radical are generated due to the heat; thus, a heat-mode recording operation is possible by combining these agents.

Examples of the radical generator include materials, such as triazine compounds having onium salt and a trihalomethyl group, peroxides azo-based polymerization initiators, azide compounds and quinone diazide. Among these, onium salt has high sensitivity and is preferably used. The following description will discuss onium salt that can be preferably used as the radical polymerization initiator of the invention. Preferable examples of the onium salt include iodonium salt, diazonium salt and sulfonium salt. In the invention, the onium salt is allowed to function not as an acid generator, but as an initiator for radical polymerization. Examples of an onium salt preferably used in the invention include those represented by the following formulas (III) to (V).

$Ar^{11}—I^{+}—Ar^{12}Z^{11-}$ General formula (III)

$Ar^{21}—N^{+}{\equiv}NZ^{21-}$ General formula (IV)

General formula (V)

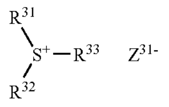

In general formula (III), $Ar^{11}$ and $Ar^{12}$ each independently represent an aryl group having 20 or less carbon atoms and may have a substituent group. When this aryl group has a substituent group, examples of the preferable substituent group include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from the group consisting of a halogen ion, a perchloric acid ion, a tetrafluoroborate ion, a hexafluorophosphate ion, a carboxylate ion and a sulfonic acid ion, and more preferably represents a perchloric acid ion, a hexafluorophosphate ion, a carboxylate ion or an aryl sulfonic acid ion.

In general formula (IV), $Ar^{21}$ represents an aryl group having 20 or less carbon atoms and possibly having a substituent group. Examples of the preferable substituent group include a halogen atom, a nitro group, an alkyl group having 12 or less carbon atoms, an alkoxy group having 12 or less carbon atoms, an aryloxy group having 12 or less carbon atoms, an alkyl amino group having 12 or less carbon atoms, a dialkyl amino group having 12 or less carbon atoms, an aryl amino group having 12 or less carbon atoms and a diaryl amino group having 12 or less carbon atoms. $Z^{21-}$ represents the same counter ion as $Z^{11-}$.

In general formula (V), $R^{31}$, $R^{32}$ and $R^{33}$ may be the same or different from each other, and each independently represent a hydrocarbon group having 20 or less carbon atoms and possibly having a substituent group. Preferable examples of the substituent group include a halogen atom, a nitro group, an alkyl group having 12 or less carbon atoms, an alkoxy group having 12 or less carbon atoms and an aryloxy group having 12 or less carbon atoms. $Z^{31-}$ represents the same counter ion as $Z^{11-}$.

In the invention, specific examples of the onium salt to be preferably used as a radical generator include those disclosed in JP-A No. 2001-133696. The following description will discuss specific examples of preferable onium salts represented by general formula (III)([OI-1] to [OI-10]), those represented by general formula (IV)([ON-1] to [ON-5]) and those represented by general formula (V)([OS-1] to [OS-7]); however, these examples should not be construed to limit the scope of the invention.

[OI-1]

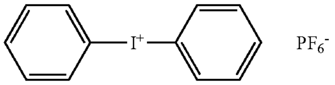

[OI-2]

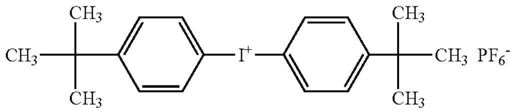

[OI-3]

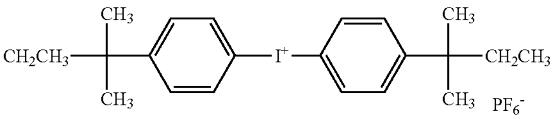

[OI-4]

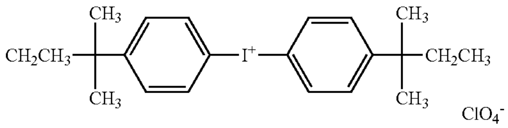

[OI-5]

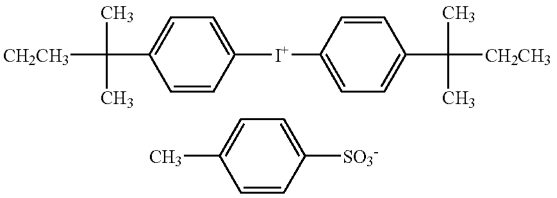

[OI-6]

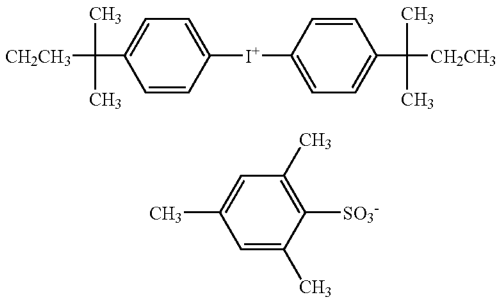

[OI-7]

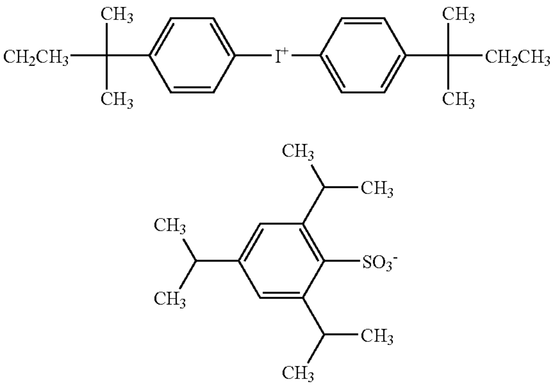

[OI-8]

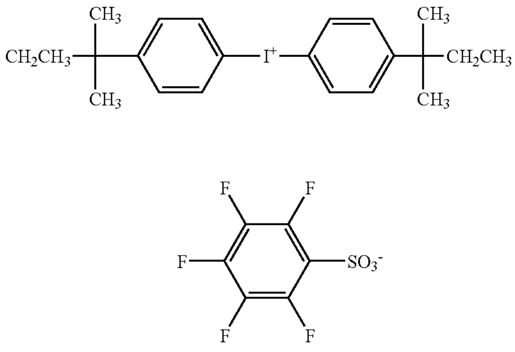

[OI-9]

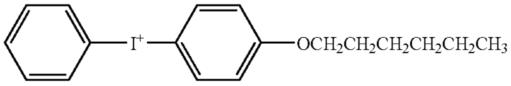

[OI-10]

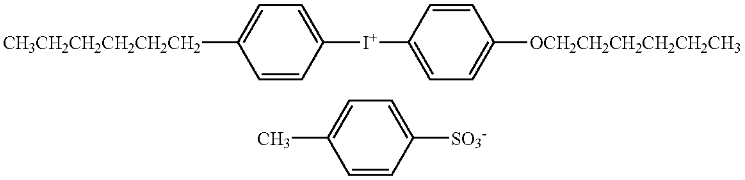

-continued
[ON-1]
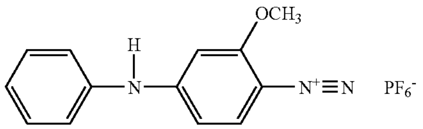
[ON-2]
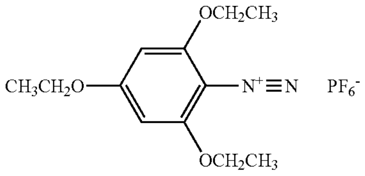
[ON-3]
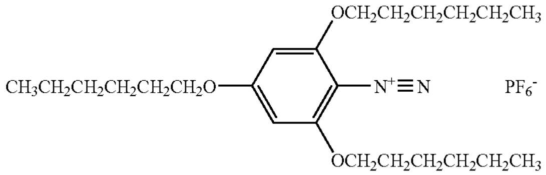
[ON-4]
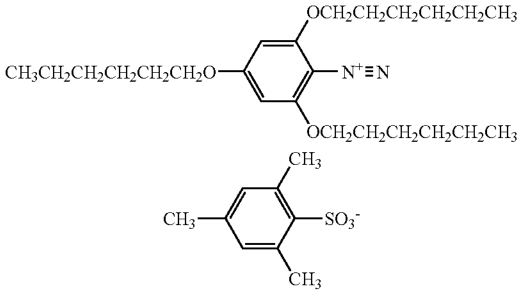
[ON-5]
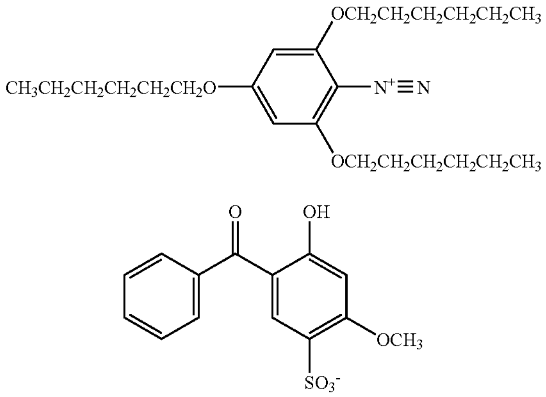
[OS-1]
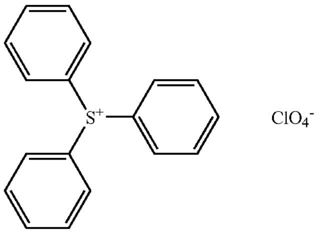
[OS-2]
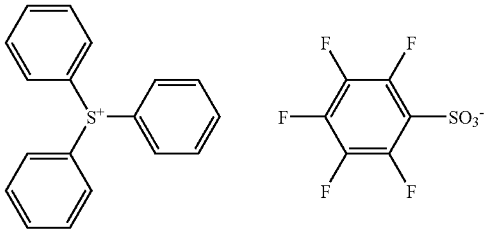
[OS-3]
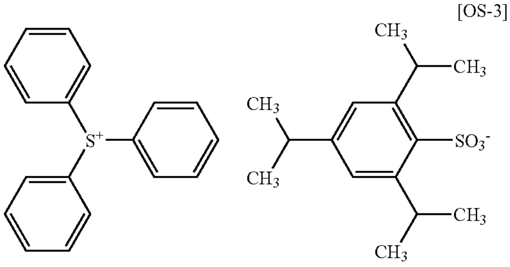

-continued

[OS-4]

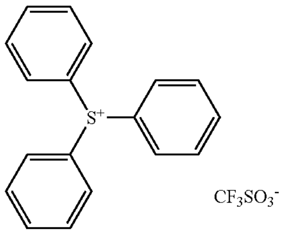

[OS-5]

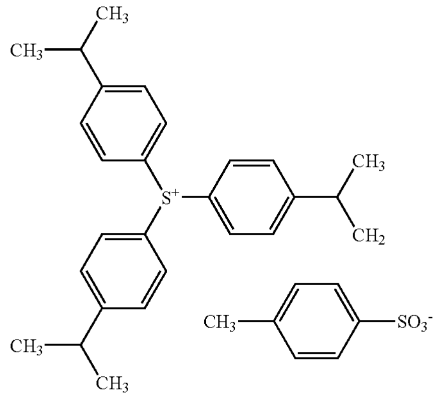

[OS-6]

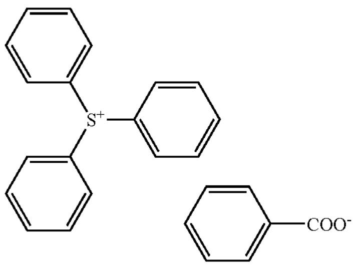

[OS-7]

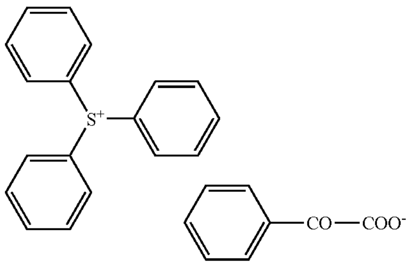

The radical generator to be used in the invention preferably have a maximum absorption wavelength of 400 nm or less, and more preferably 360 nm or less. By setting the absorbing wavelength in an ultraviolet-ray area, the resulting image-recording material can be handled under a white lamp.

Moreover, examples of another preferable polymerization initiator include specific aromatic sulfonium salts disclosed in Japanese Patent Application Nos. 2000-266797, 2001-177150, 2000-160323 and 2000-184603.

Most preferable examples of the polymerization initiator of the invention include titanocene compounds, aromatic sulfonium salts and trihallomethyl-S-triazine compounds.

The following description will discuss typical compounds described in Japanese Patent Application Nos. 2000-266797 and 2001-177150, which are other preferable polymerization initiators applicable to the invention.

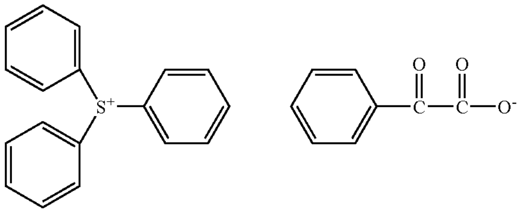

-continued

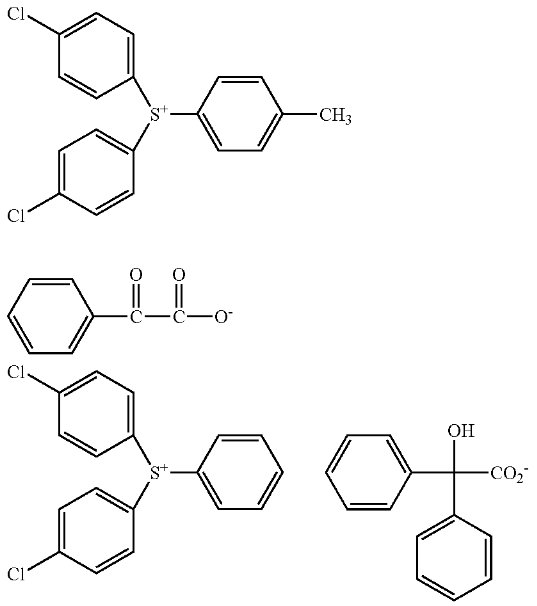

Each of these polymerization initiators is added to the image recording layer in an amount of 0.1 to 50% by weight, more preferably 0.5 to 30% by weight, and most preferably 1 to 20% by weight, based on the entire solid components of the image recording layer. When the amount of addition is less than 0.1% by weight, sensitivity tends to become poor, and when the amount of addition exceeds 50% by weight, stains tend to occur on non-image portions upon printing. With respect to these polymerization initiators, only one kind thereof may be used, or two or more kinds thereof may be used in combination. These polymerization initiators may be added together with other components to the same layer, or alternatively may be added to a different layer.

(IR Absorber)

In the case when the image-forming is carried out by irradiating the planographic printing plate precursor of the invention with infrared rays having wavelength of 760 to 1,200 nm emitted from a laser serving as a light source, normally, it is necessary to use an IR absorber. The IR absorber has a function of converting absorbed infrared rays to heat. The IR absorber to be used in the invention is a dye or a pigment having a maximum absorbance in a range of 760 nm to 1200 nm.

Examples of dyes to be used include commercially available dyes and dyes described in "Handbook of Dyes" (edited by the Association of Organic Synthesis (1970)). Specific examples thereof include azo dyes, azo dyes in the form of a metallic complex salt, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Preferable examples of the dyes include cyanine dyes described in, for example, JP-A Nos. 58-125246, 59-84356, 59-202829, and 60-78787; methine dyes described in, for example, JP-A Nos. 58-173696, 58-181690, and 58-194595; naphthoquinone dyes described in, for example, JP-A Nos. 58-112793, 58-224793, 59-48187, 59-73996, 60-52940 and 60-63744; squarylium dyes described in, for example, JP-A No. 58-112792; and cyanine dyes described in U.K. Patent No. 434,875.

Other compounds which can be suitably used as the dyes include a near-infrared ray absorbing sensitizer described in U.S. Pat. No. 5,156,938. Also, particularly suitable compounds include: a substituted arylbenzo(thio)pyrylium salt described in U.S. Pat. No. 3,881,924; a trimethinethiopyrylium salt described in JP-A No. 57-142645 (U.S. Pat. No. 4,327,169); pyrylium-based compounds described in JP-A Nos. 58-181051, 58-220143, 59-41363, 59-84248, 59-84249, 59-146063, and 59-146061; a cyanine dye described in JP-A No. 59-216146; a pentamethinethiopyrylium salt described in U.S. Pat. No. 4,283,475; and pyrylium compounds described in Japanese Patent Application Publication (JP-B) Nos. 5-13514 and 5-19702. Moreover, other examples of particularly preferred dyes include the near-infrared ray absorbing pigments represented by the formulae (I) and (II) described in U.S. Pat. No. 4,756,993.

Furthermore, other examples of the near-infrared ray absorbing pigments include specific indolenine cyanine dyes described in Japanese Patent Applications Nos. 2001-6326 and 2001-237840, which will be shown below:

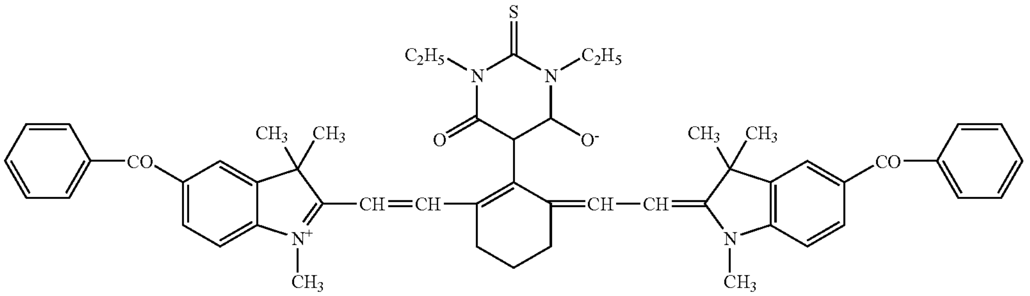

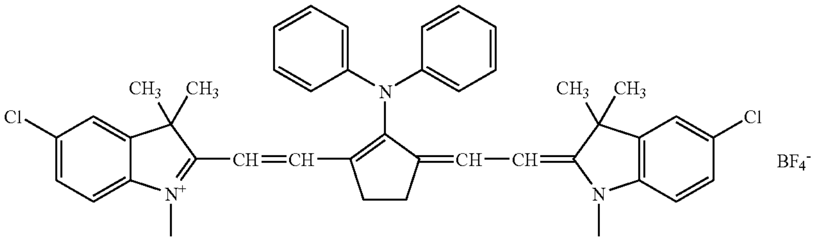

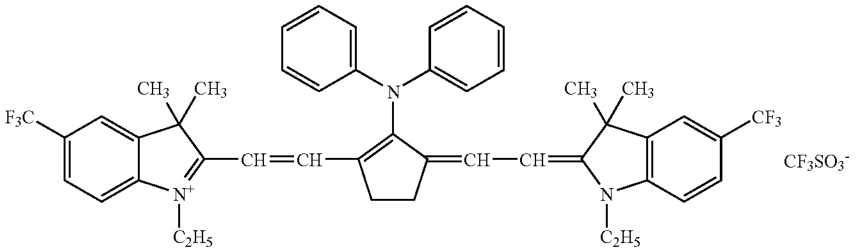

Among these dyes, particularly preferred dyes are cyanine dyes, squarylium dyes, pyrylium salts, nickel thiolate complexes and indolenine cyanine dyes. Cyanine dyes and indolenine cyanine dyes are more preferably used, and one of the most preferable examples is a cyanine dye represented by the following general formula (VI):

General Formula (VI)

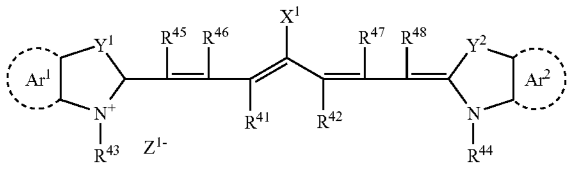

In general formula (VI), $X^1$ represents a halogen atom or $X^2$-$L^1$. Here, $X^2$ represents an oxygen atom or a sulfur atom, and $L^1$ represents a hydrocarbon group having 1 to 12 carbon atoms. $R^{41}$ and $R^{42}$ each independently represent a hydrocarbon group having 1 to 12 carbon atoms. From a viewpoint of storage stability of the coating solution for forming photosensitive layer, $R^{41}$ and $R^{42}$ preferably represent a hydrocarbon group having two or more carbon atoms, and $R^{41}$ and $R^{42}$ are more preferably bonded to each other to form a 5-membered ring or a 6-membered ring.

$Ar^1$ and $Ar^2$ may be the same or different from each other, and represent an aromatic hydrocarbon group possibly having a substituent group. Examples of preferably aromatic hydrocarbon groups are a benzene ring and a naphthalene ring. Moreover, examples of preferable substituent groups are a hydrocarbon group having 12 or less carbon atoms, a halogen atom and an alkoxy group having 12 or less carbon atoms. $Y^1$ and $Y^2$ may be the same or different from each other, and each independently represent a sulfur atom or a dialkyl methylene group having 12 or less carbon atoms. $R^{43}$ and $R^{44}$ may be the same or different from each other, each independently represent a hydrocarbon group having 20 or less carbon atoms, and may have a substituent group. With respect to the preferable substituent group, examples thereof include an alkoxy group, carboxyl group and a sulfo group having 12 or less carbon atoms. $R^{45}$, $R^{46}$, $R^{47}$ and $R^{48}$ may be the same or different from each other, and each independently represent a hydrogen atom or a hydrocarbon group having 12 or less carbon atoms. From a viewpoint of availability, hydrogen atom is preferably used. $Z^{1-}$ represents a counter anion; however, when any one of $R^{41}$ to $R^{48}$ is substituted by a sulfo group, $Z^{1-}$ is not necessary. From a viewpoint of storage stability of the coating solution for forming the photosensitive layer, preferable examples of $Z^{1-}$ include a halogen ion, a perchloric acid ion, a tetrafluoroborate ion, a hexafluorophosphate ion and a sulfonic acid ion, and more preferable examples are a perchloric acid ion, a hexafluorophosphate ion and an aryl sulfonic acid ion.

In this invention, specific examples of cyanine dyes that are preferably used and represented by general formula (VI) include those pigments described in paragraphs [0017] to [0019] in JP-A No. 2001-133969.

Moreover, other preferable examples thereof include specific indolenine cyanine dyes described in the specifications of the aforementioned Japanese Patent Applications Nos. 2001-6326 and 2001-237840.

With respect to the pigment to be used in the invention, commercially available pigments and those pigments described in "Color-Index (C.I.) Handbook", "The Handbook of the Latest Pigments" (edited by the Japan Association of Pigment Technologies (1977), "Latest Pigment Application Technologies" (CMC Publishing Co., Ltd., 1986), and "Printing Ink Technologies" (CMC Publishing Co., Ltd., 1984) may be utilized.

With respect to the types of pigments, examples thereof include: black pigments, yellow pigments, orange pigments, brown pigments, red pigments, purple pigments, blue pigments, green pigments, fluorescent pigments and metal powder pigments, and in addition, polymer bonded dyes. Specific examples thereof include: insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments and carbon black. Among these pigments, carbon black is preferably used.

These pigments may be used without being surface-treated or may be used after being surface-treated. The surface treatment is not particularly limited and examples thereof include a method in which a resin or a wax is coated on the surface of a pigment, a method in which a surfactant is adhered to the surface of the pigment, and a method in which a reactive substance (for example, a silane coupling agent, an epoxy compound, or polyisocyanate) is bound to the surface of the pigment. These surface treating methods are described in, for example, "Properties and Applications of Metal Soaps" (Saiwai Shobo Co., Ltd.), "Printing Ink Technologies" (CMC Publishing Co., Ltd. (1984), and "Latest Pigment Application Technologies" (CMC Publishing Co., Ltd., 1986).

The particle size of the pigments is preferably in a range of 0.01 to 10 μm, more preferably in a range of 0.05 to 1 μm, and most preferably in a range of 0.1 to 1 μm. If the particle size is less than 0.01 μm, dispersion stability of the pigments in a coating solution used for preparing the image photosensitive layer is insufficient, and if the particle size is larger than 10 μm, uniformity of the photosensitive layer is poor.

A known dispersion technique employed in the preparation of ink, toners, and the like can be used for the purpose of dispersing the pigments. A known dispersing machine can be used for dispersion of the pigments, and examples of the dispersing machine include an ultrasonic dispersing machine, a sand mill, an attritor, a pearl mill, a super mill, a ball mill, an impeller, a disperser, a KD mill, a colloid mill, a dynatron, a three-roller mill, a pressurized kneader, and the like. These dispersion techniques are described in "Latest Pigment Application Technologies" (CMC Publishing Co., Ltd. (1986)) in detail.

Each of these IR absorbers may be added to the same layer together with other components, or may be added to another layer that is provided separately. An amount of the IR absorber to be added should be set, upon formation of the negative-type planographic printing plate precursor, so that a light absorbance of the image recording layer at the maximum absorption wavelength in a range of 760 to 1200 nm is within a range of 0.5 to 1.2 when measured by the reflection measuring method. The absorbance of the image recording layer is preferably within a range of 0.6 to 1.15 from the viewpoint of strength of the image area.

The absorbance of the photosensitive layer can be adjusted by controlling the amount of an IR absorber to be added to the photosensitive layer and the thickness of the photosensitive layer. The measurement of the absorbance may be carried out by a commonly-used method. With respect to the measuring methods, for example, a recording layer the amount of coating after drying of which is appropriately determined in a necessary range as a planographic printing plate is formed on a reflective support such as aluminum, and the reflection density is measured by using an optical densitometer, and another method in which a spectrophotometer is used for the measurement based upon the reflection method using an integrating sphere, may be used.

With respect to the photo- or thermo-polymerizable composition that is preferably used for the image recording layer of the planographic printing plate precursor of the invention, in addition to the above-mentioned basic components, other components that are suitable for its application, manufacturing method and the like may be added if necessary. The following description will discuss preferable additive agents.

(Co-sensitizer)

By adding a co-sensitizer to a second layer (recording layer) of the planographic printing plate precursor of the invention, the recording sensitivity can be further improved. Though the operation mechanism therefor is not clearly known, it is thought to be based on the following chemical process. That is, the co-sensitizer is considered to react with various intermediate active species (e.g., radical, peroxide, oxidizing agent, reducing gent) generated during the process of photochemical reaction initiated upon light absorption of the photopolymerization initiator (system) and subsequent addition polymerization reaction, to generate a new active radical; thus, the radical is estimated to allow the polymerization reaction to further progress. The co-sensitizers can be mainly classified into (a) those which are reduced to produce an active radical, (b) those which are oxidized to produce an active radical and (c) those which react with a low active radical to convert it into a radical having higher activity, or act as a chain transfer agent. However, in many cases, a common view has not been established on the cases to which individual compounds belong.

(a) Compounds which are Reduced to Produce an Active Radical (a-1) Compounds having carbon-halogen bond: The carbon-halogen bond is considered to reductively cleaved to generate an active radical.

More specifically, for example, trihalomethyl-s-triazines, trihlomethyloxadiazoles and the like can be preferably used.

(a-2) Compounds having nitrogen-nitrogen bond: The nitrogen-nitrogen bond is considered to reductively cleaved to generate an active radical.

More specifically, hexaarylbiimidazoles and the like can be preferably used.

(a-3) Compounds having oxygen-oxygen bond: The oxygen-oxygen bond is considered to reductively cleaved to generate an active radical.

More specifically, for example, organic peroxides and the like can be preferably used.

(a-4) Onium compounds: The carbon-hetero bond or oxygen-nitrogen bond is considered to reductively cleaved to generate an active radical.

More specifically, for example, diaryliodonium salts, triarylsulfonium salts, N-alkoxypyridinium (azinium) salts and the like can be preferably used.

(a-5) Ferrocene, iron arene complexes: An active radical is reductively produced.

(b) Compounds Which are Oxidized to Produce an Active Radical (b-1) Alkylate complexes: The carbon-hetero bond is considered to oxidatively cleave to produce an active radical.

More specifically, for example, triarylalkyl borates can be preferably used.

(b-2) Alkylamine compounds: The C—X bond on the carbon adjacent to nitrogen is considered to cleave by the oxidation to produce an active radical. X is preferably a hydrogen atom, a carboxyl group, a trimethylsilyl group or a benzyl group.

Specific examples of this compound include ethanolamines, N-phenylglycines and N-trimethylsilylmethylanilines.

(b-3) Sulfur-containing or tin-containing compounds: These compounds result from the displacement of the nitrogen atom of the above-mentioned amines by sulfur atom or tin atom, and an active radical is produced by the same action. Also, for the compounds having an S—S bond, sensitization due to the cleavage of S—S bond is known.

(b-4) α-Substituted methylcarbonyl compounds: By the oxidation, the bond between carbonyl-αcarbon is cleaved so that an active radical is produced. The compounds in which the carbonyl is converted into an oxime ether exhibit the same action.

Specific examples include 2-alkyl-1-[4-(alkylthio)phenyl]-2-morpholinopronone-1 compounds and oxime ethers obtained by reacting the compound with a hydroxyamine and etherifying the N—OH.

(b-5) Sulfinates: An active radical is reductively produced.

Specific examples include sodium arylsulfinate.

(c) Compounds which React with a Radical and Convert it into a Highly Active Radial or Act as a Chain Transfer Agent:

Compounds having, for example, SH, PH, SiH or GeH within the molecule are used. These provide hydrogen to a low active radical seed to produce a radical or are oxidized and then remove the proton to produce a radical. Specific examples include 2-mercaptobenzimidazoles. More specific examples of these co-sensitizers include a large number of compounds described as an additive for improving the sensitivity in JP-A No. 9-236913. Some of those compounds are set forth below; however, the co-sensitizer which can be used in the photosensitive layer of the negative-type planographic printing plate of the invention is by no means limited thereto.

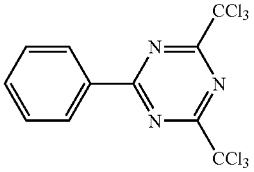

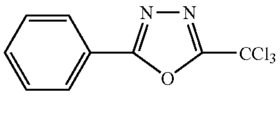

-continued

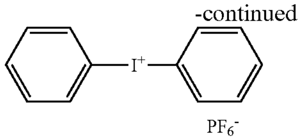

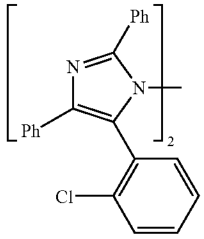

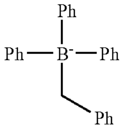

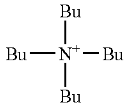

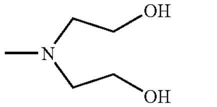

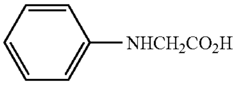

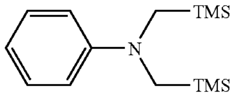

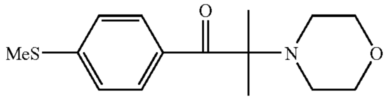

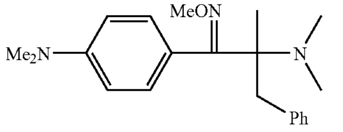

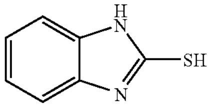

The co-sensitizer can also be subjected to various chemical modifications so as to improve the properties of the photosensitive layer. Examples of the chemical modification which can be used include the methods such as bonding with a sensitizing dye, titanocene, an addition polymerizable unsaturated compound or other radical-generating part, introduction of a hydrophilic site, introduction of a substituent to improve the compatibility or prevent the precipitation of crystal, introduction of a substituent capable of improving the adhesive property, and polymer formation. These co-sensitizers may be used individually or in combination of two or more thereof.

An amount of use of the co-sensitizer is suitably from 0.05 to 100 parts by weight, preferably from 1 to 80 parts by weight, more preferably from 3 to 50 parts by weight, per 100 parts by weight of the compound having an ethylenically unsaturated double bond.

(Polymerization Inhibitor)

Moreover, in the negative-type polymerizable recording layer that is particularly preferable as a recording layer of the invention, a slight amount of a thermopolymerization inhibitor is preferably added so as to inhibit unnecessary thermopolymerization of the polymerizable compound having an ethylenically unsaturated double bond during preparation or storage of the photosensitive composition that forms the recording layer.

Preferable examples of the thermopolymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenylhydroxy amine primary cerium salt.

An amount of the thermopolymerization inhibitor to be added is preferably set in a range of about 0.01% by weight to about 5% by weight based on the weight of nonvolatile components in the entire composition.

If necessary, a higher fatty acid derivative such as behenic acid or behenic acid amide may be added and allowed to localize on the surface of the photosensitive layer in the process of drying after the coating, so as to prevent polymerization inhibition by oxygen. The amount of the higher fatty acid derivative to be added is preferably set in a range of about 0.5 to about 10% by weight based on the weight of nonvolatile components in the entire composition.

(Colorant)

Furthermore, a dye or a pigment may be added to the recording layer of the invention for the purpose of coloring the recording layer. Thereby, the plate inspecting properties such as the visibility after the plate making and the image densitometer aptitude can be improved.

Here, many dyes cause reduction in the sensitivity of a photopolymerization-system recording layer; therefore, a pigment is preferably used as the colorant.

Specific examples of the dye or pigment suitable for the colorant include: pigments such as phthalocyanine-type pigment, azo type pigment, carbon black and titanium oxide, and dyes such as Ethyl Violet, Crystal Violet, azo type dye, anthraquinone type dye and cyanine type dye.

An amount of the dye or pigment to be added is preferably from about 0.5 to about 5% by weight based on the solid components of the entire composition.

(Other Additives)

In addition, in order to improve the physical properties of the cured film, an inorganic filler or other known additives such as plasticizer and ink receptivity agent capable of improving the inking property on the surface of the recording layer may also be added to the second layer of the invention.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10% by weight or less based on the total weight of the polymer binder and addition polymerizable compound. Furthermore, for the purpose of improving the film strength (printing press life) which is described later, a UV initiator or a thermal cross-linking agent may also be added to intensify the effect of heating or exposure after the development.

The upper layer (second layer) is formed on the surface of the above-mentioned lower layer (first layer), and upon forming the upper layer, a photopolymerizable composition containing the components for the upper layer is dissolved in an organic solvent of various types and then coated on the surface of the lower layer. Examples of the solvent used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is preferably from 2 to 50% by weight.

Here, upon selection of the coating solvent for the recording layer, it is preferable to adopt a solvent that hardly dissolves the lower-layer components in order to suppress compatibility to the lower layer.

The coating amount of the photosensitive layer has an effect mainly on the sensitivity and developability of the photosensitive layer and the strength and printing press life of the exposed film; therefore, an appropriate coating amount is preferably selected according to the use. If the coating amount is too small, a sufficiently long printing press life cannot be obtained, whereas if it is too large, the sensitivity decreases, the exposure takes time and the development processing disadvantageously takes a long time; therefore, the coating amount is properly determined by taking these points into consideration. When used as the second layer of the imagewise-exposed negative-type planographic printing plate precursor of the invention, the coating amount of the photosensitive layer after drying is preferably from 0.5 to 5.0 μm, more preferably from 0.5 to 2.0 μm, and most preferably from 1.0 to 1.5 μm. When the thickness is 0.5 μm or less, the curing process becomes insufficient in the upper layer, or it becomes difficult to provide a sufficient developing resistant property, resulting in degradation in the printing press life. On the other hand, the thickness exceeding 5.0 μm makes it difficult to carry out the manufacturing process.

The image recording layer of the invention is characterized in that, upon exposure with a laser beam, a portion of an exposed area in the vicinity of the interface to a support is not cured. With respect to the degree of curing when measured from the vicinity of the support, preferably, 0.5 to 80% of the thickness of the photosensitive layer is in an uncured state, and more preferably 2 to 70% thereof, and most preferably 5 to 60% thereof is in an uncured state. When the uncured area measured from the vicinity of the support is 0.5% or less of the thickness of the image recording layer, the image quality tends to deteriorate. On the other hand, when the uncured area exceeds 80%, the strength of the cured film becomes insufficient, causing degradation in the printing press life.

In the case of an image recording layer of a two-layer structure that is an embodiment of the invention, with respect to the image recording layer as a whole, the developing rate at an unexposed area developed by an alkaline developer having a pH of 10 to 13.5 is preferably 100 nm/sec or more, and the permeation rate at an exposed area by the alkaline developer is preferably 100 nF/sec or less.

(Measurement of Developing Rate by Alkaline Developer)

The developing rate of the image recording layer refers to a value obtained by dividing the film thickness (nm) of the image recording layer by time (sec) required for the developing process.

The measuring method of the developing rate in the invention will be explained below with reference to FIG. 1. A photosensitive material 10 comprises a photosensitive layer 12 and an aluminum substrate (a support) 14. An aluminum substrate 14 having an unexposed image recording layer 12 formed thereon is immersed in a predetermined alkaline developer 16 (30° C.) having a pH value of 10 to 13.5. The dissolving behavior of the image recording layer 12 is examined by using a DRM interference measuring device. FIG. 1 shows a schematic diagram of the DRM interference measuring device for measuring the dissolving behavior of the image recording layer. In the invention, the variations of the film thickness are detected based upon interference obtained by using light having a wavelength of 640 nm. When the developing behavior relates to a non-swelling phenomenon from the surface of the image recording layer, the film thickness gradually decreases as the developing time elapses so that an interference wave in accordance with the thickness is obtained. Moreover, in the case of the swelling dissolution (defilming dissolution), since the film thickness varies depending on permeation of the developer, it is not possible to obtain a clear interference wave.

The measurement is continued under these conditions, and based upon the period of time (sec) required for the film thickness to become zero after the complete removal of the image recording layer (development completion time) and the film thickness (nm), the developing rate can be obtained based on the following equation. A higher developing rate means that the film can easily be removed by the developer, and that better developing property is exhibited.

Unexposed portion developing rate (nm/sec)=[Thickness of image recording layer (nm)/Development completion time (sec)]

(Measurement of Permeation Rate of Alkaline Developer)

The permeation rate of alkaline developer indicates the rate of a change in the electrostatic capacity (F) when the above-mentioned recording layer, formed on a conductive support, is immersed in developer.

Figure 2:
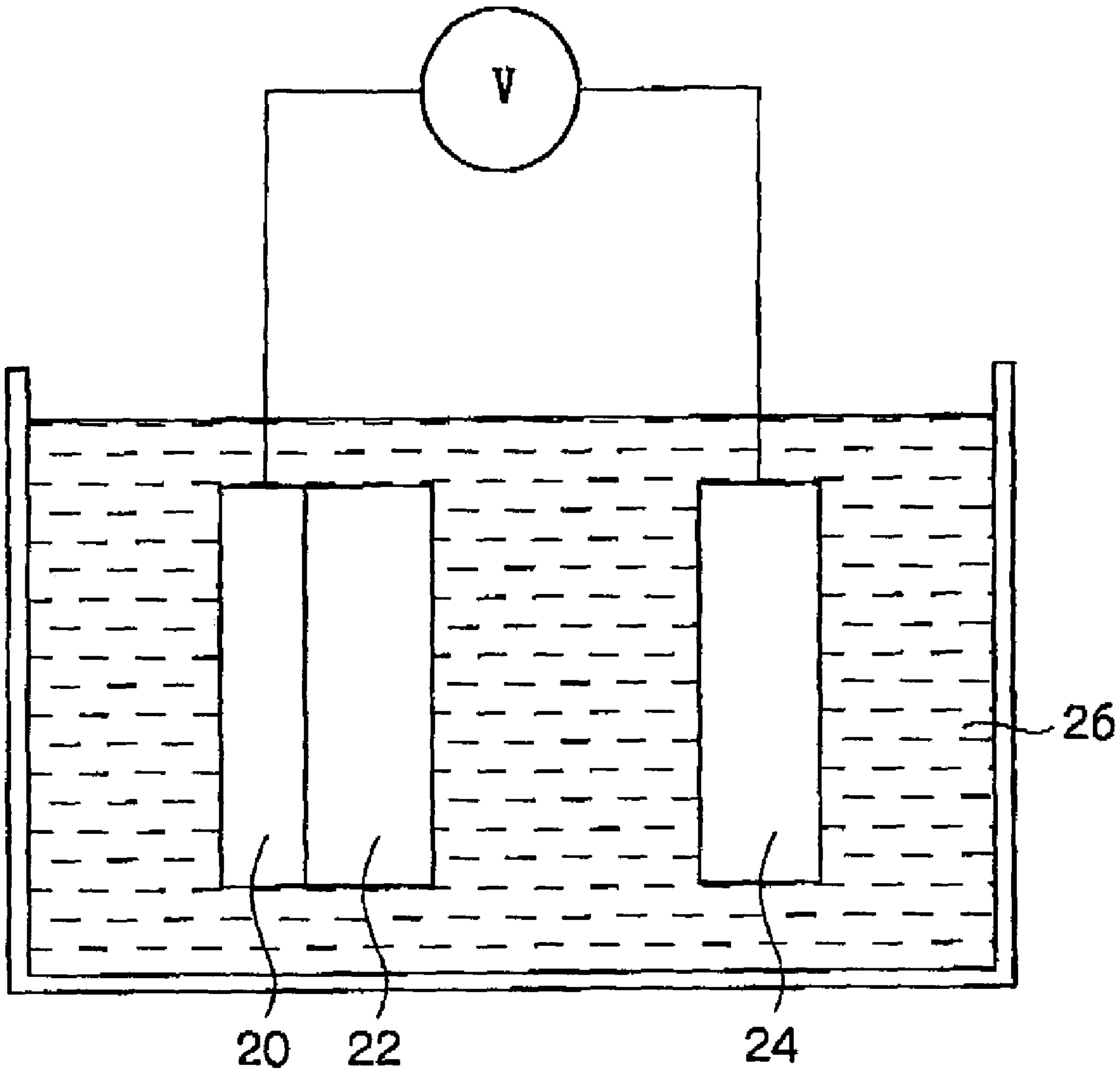
FIG. 2 is a schematic diagram that explains one example of a method for measuring electrostatic capacity. The method is used for evaluating the permeability of a developer to an image recording layer.

The measuring method of the electrostatic capacity that serves as a scale for permeability is explained with reference to FIG. 2. Two electrodes are immersed in a predetermined alkaline developer 26 (28° C.) having a pH value in a range of 10 to 13.5. One electrode is an aluminum substrate (a support) 20 connected to a wire. An image recording layer 22 that has been cured by being exposed with a predetermined dose of exposure is disposed on the aluminum substrate 20. The other electrode is a normal electrode 24. A voltage is applied to the electrodes, and as the immersion time progresses after the application of the voltage, the developer 26 permeates the interface between the aluminum substrate 20 and the image recording layer 22, resulting in a change in the electrostatic capacity.

The permeation rate is obtained from the following equation based on an amount of time (sec) required for the electrostatic capacity to become constant, and the saturated value of electrostatic capacity (nF) of an exposed portion of the image recording layer. A smaller permeation rate indicates that a permeability of the developer is lower.

Permeation rate of developer in an exposed portion=[Saturated value of electrostatic capacity (nF)/Time required for electrostatic capacity to become constant (sec)]

With respect to preferable physical properties of the image recording layer in the planographic printing plate precursor of the invention, the developing rate of the unexposed portion by the alkaline developer having a pH of 10 to 13.5 is preferably 100 nm/sec or more, and the permeation rate of the same alkaline developer with respect to the exposed portion of the image recording layer is preferably 100 nF/sec or less. The upper limit value of the developing rate and the lower limit value of the permeation rate are not particularly limited. From a viewpoint of the balance of the two factors, the developing rate of the unexposed portion is preferably in a range of 100 to 300 nm/sec, and the permeation rate of the alkaline developer to an exposed portion is preferably 80 nF/sec or less.

The control of the developing rate of the unexposed portion of the image recording layer and the permeation rate of the alkaline developer with respect to an exposed portion of the image recording layer after being cured may be carried out by commonly-used methods. As typical examples, an addition of a hydrophilic compound is effectively used for improving the developing rate of the unexposed portion, and an addition of a hydrophobic compound is effectively used for suppressing permeation of the developer into the exposed portion.

The application of the above-mentioned specific binder polymer of the invention makes it possible to easily adjust the developing rate of the image recording layer and the permeation rate of the developer to the above-mentioned preferable ranges.

[Support]

With respect to the support of the planographic printing plate precursor of the invention, conventionally known hydrophilic supports for use in planographic printing plate precursors may be used without limitation.

The support is preferably a dimensionally stable plate-like material. Examples thereof include paper, paper laminated with plastic (for example, polyethylene, polypropylene, polystyrene and the like), a metal plate (for example, aluminum, zinc, copper and the like), a plastic film (for example, cellulose diacetate, cellulose triacetate, cellulose propionate, cellulose lactate, cellulose acetate lactate, cellulose nitrate, polyethylene terephthalate, polyethylene, polystyrene, polypropylene, polycarbonate and polyvinyl acetal) and paper, plastic film or the like on which the above-mentioned metal is laminated or vapor-deposited. The surface of each of these materials may be subjected to an appropriate known physical or chemical treatment in order to impart a hydrophilic property thereto or improve the strength thereof, if necessary.

In particular, examples of preferable supports are: paper, polyester or aluminum plates, and aluminum plates, which have good dimensional stability and low costs, and are capable of providing a surface having superior hydrophilic property and strength through surface treatments, if necessary, are more preferably used. Moreover, composite sheets as described in JP-B No. 48-18327, in which an aluminum sheet is joined to a polyethylene terephthalate film, may also be used.

The aluminum plate is a dimensionally stable metal plate mainly made of aluminum, and may be selected from a pure aluminum plate, an alloy plate mainly made of aluminum with a fine amount of dissimilar elements being contained therein, and a plastic film or paper on which aluminum (alloy) is laminated or vapor-deposited. In the following description, the above-mentioned substrate made of aluminum or aluminum alloy is generically referred to as an aluminum substrate. Examples of the dissimilar element contained in the aluminum alloy include silicon, iron, manganese, copper, magnesium, chromium, zinc, bismuth, nickel and titanium. The content of the dissimilar element in the alloy is 10% by weight or less. In the invention, though a pure aluminum plate is preferably used, it is difficult to produce a completely pure aluminum in view of the refinement technology. Therefore, aluminum containing a trace amount of dissimilar elements may be used. As such, the aluminum plate for use in the invention cannot be specified about its composition and may be appropriately selected from the aluminum plates comprising conventionally known and commonly used materials, for example, JIS A 1050, JIS A 1100, JIS A 3103, JIS A 3005 and the like.

The aluminum plate to be used in the present invention has a thickness of approximately 0.1 to 0.6 mm. This thickness may be changed depending on the size of a printing plate and the user's desire. The aluminum substrate may be preferably subjected to a surface treatment described below, if necessary.

(Surface Roughening Treatment)

Examples of the surface roughening method include a mechanical roughening treatment, chemical etching and electrolytic grain treatment, as disclosed in JP-A No. 56-28893. Moreover, an electrochemical surface roughening method in which a roughening process is electrochemically carried out in an electrolytic solution such as hydrochloric acid or nitric acid and a mechanical roughening method such as a wire brush grain method in which the aluminum surface is scratched by metal wires, a ball grain method in which the aluminum surface is subjected to a blast-polishing process by using polishing balls and polishing agent and a brush grain method in which the surface is roughened by using a nylon brush and a polishing agent, may also be used, and the above-mentioned roughening methods may be used alone, or may be used in combination. Among these, the method to be effectively used as the surface-roughening treatment is the electrochemical method that carries out a roughening treatment chemically in a hydrochloric acid or nitric acid electrolytic solution, and an appropriate anode time electricity is set in a range of 50 $C/dm^2$ to 400 $C/dm^2$. More specifically, it is preferable to carry out an alternating current and/or direct current electrolysis under conditions of the temperature of the solution of 20 to 80° C., the duration of the electrolysis of 1 second to 30 minutes and the current density of 100 $C/dm^2$ to 400 $C/dm^2$ in an electrolyte solution containing hydrochloric acid or nitric acid having a concentration of 0.1 to 50%.

The aluminum substrate that has been subjected to a surface-roughening treatment as described above may be chemically etched by using acid or alkali. Examples of the preferable etching agent include: caustic soda, carbonate soda, aluminate soda, methasilicate soda, phosphate soda, potassium hydroxide and lithium hydroxide, and preferable concentration and temperature ranges are respectively 1 to 50% and 20 to 100° C. The substrate is then subjected to an acid washing process in order to remove stains (smut) remaining on the surface after etching. The acid to be used is nitric acid, sulfuric acid, phosphoric acid, chromic acid, fluoric acid, borohydrofluoric acid or the like. In particular, with respect to the smut-removing method after the electrochemical surface-roughening treatment, a method in which the substrate is made in contact with sulfuric acid having a concentration of 15 to 65% by weight at a temperature of 50 to 90° C., as described in JP-A No. 53-12739, and a method in which the substrate is subjected to an alkali etching process, as described in JP-B No. 48-28123, are proposed.

Methods and conditions for the above treatment are not particularly limited as long as the center-line average roughness Ra of the treated surface is 0.2 to 0.5 μm after the above-mentioned treatment.

(Anodic Oxidation Treatment)

The aluminum substrate on which the oxide layer that has been processed as described above is formed is then subjected to an anodic oxidation treatment. In the anodic oxidation treatment, aqueous solutions of sulfuric acid, phosphoric acid, oxalic acid and boric acid/sodium borate may be used alone, or a plurality of thereof may be used in combination to form main components of an electrolytic bath. In this case, at least an Al alloy plate, electrodes and components usually contained in tap water, groundwater or the like may of course be contained in the electrolytic solution. Moreover, second and third components may be added thereto. Here, the second and third components include, for example, cations, such as metallic ions like Na, K, Mg, Li, Ca, Ti, Al, V, Cr, Mn, Fe, Co, Ni, Cu, Zn, etc., and ammonium ions, and anions such as nitric acid ion, carbonic acid ion, chlorine ion, phosphoric acid ion, fluorine ion, sulfurous acid ion, titanic acid ion, silicic acid ion, boric acid ion, etc., and these may be contained with a concentration of approximately 0 to 10000 ppm.

Although not particularly limited, the anodic oxidation is carried out through a direct current or alternating current electrolysis, preferably under the conditions of the amount of solution of 30 to 500 g/liter, the temperature of treatment solution of 10 to 70° C. and the current density of 0.1 to 40 $A/m^2$. The thickness of the anodic oxidized coat film thus formed is set in a range of 0.5 to 1.5 μm. More preferably, the range is set from 0.5 to 1.0 μm. With respect to the support formed as described above, the treatment conditions need to be selected so that the pore diameter of micropores existing in the anodic oxidized coat film is in a range of 5 to 10 nm, with the pore density being in a range of $8\times10^{15}$ to $2\times10^{16}$ per $m^2$.

The surface of the above-mentioned support is normally subjected to a hydrophilization treatment so as to prevent stains in the non-image area. With respect to the hydrophilization treatment, various known methods may be used. Among these, preferred is a method of hydrophilizing the support by silicate, polyvinyl phosphonic acid or the like. With respect to the film thickness of the hydrophilic coat film, the film is formed using Si or P element in an amount of 2 to 40 $mg/m^2$, preferably from 4 to 30 $mg/m^2$. The amount of coating can be measured by the fluorescent X-ray analysis method.

In the above-mentioned hydrophilization treatment, the aluminum substrate bearing an anodic oxide film formed thereon is dipped in an aqueous solution having a pH at 25° C. of 10 to 13 and containing the alkali metal silicate or polyvinyl phosphonic acid in an amount of 1 to 30% by weight, preferably from 2 to 15% by weight, for example, at a temperature of 15 to 80° C. for 0.5 to 120 seconds.

Examples of the alkali metal silicate for use in the hydrophilization treatment include sodium silicate, potassium silicate and lithium silicate. Examples of the hydroxide used for elevating the pH of the aqueous alkali metal silicate solution include sodium hydroxide, potassium hydroxide and lithium hydroxide. In this processing solution, an alkaline earth metal salt or a Group IVB metal salt may also be blended. Examples of the alkaline earth metal salt include nitrates such as calcium nitrate, strontium nitrate, magnesium nitrate and barium nitrate, and water-soluble salts such as sulfate, hydrochloride, phosphate, acetate, oxalate and borate. Examples of the Group IVB metal salt include titanium tetrachloride, titanium trichloride, potassium titanium fluoride, potassium titanium oxalate, titanium sulfate, titanium tetraiodide, zirconium chloride oxide, zirconium dioxide, zirconium oxychloride and zirconium tetrachloride.

The alkaline earth metal salts and the Group IVB metal salts may be used individually or in combination of two or more thereof.

The metal salt is preferably used in an amount of 0.01 to 10% by weight, more preferably from 0.05 to 5.0% by weight.

The silicate electrodeposition described in U.S. Pat. No. 3,658,662 is also effective. Furthermore, the surface treatment in which a support subjected to electrolysis graining is combined with the above-mentioned anodic oxidation and hydrophilization treatment, disclosed in JP-B No. 46-27481, JP-A Nos. 52-58602 and 52-30503, is also effectively used.

[Intermediate Layer]

With respect to the negative-type planographic printing plate precursor in the invention, an intermediate layer may be placed between the image recording layer and the support substrate in order to improve the adhesiveness and stain-proof property. Specific examples thereof include those disclosed in JP-13 No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, Japanese Patent Applications Nos. 8-225335, 8-270098, 9-195863, 9-195864, 9-89646, 9-106068, 9-183834, 9-264311, 9-127232, 9-245419, 10-127602, 10-170202, 11-36377, 11-165861, 11-284091, 2000-14697, etc.

[Protective Layer]

In a preferred embodiment of the photo- or thermo-polymerizable negative-type planographic printing plate precursor of the invention, the exposure is usually performed in the air; therefore, a protective layer is preferably further provided on the above-mentioned image recording layer. The protective layer prevents a low molecular compound such as oxygen or basic substance present in the air, which inhibits the image forming reaction caused by the exposure in the photosensitive layer, from mixing into the photosensitive layer, and thereby enables the exposure in the air. For this purpose, the protective layer is required to have a low permeability to low molecular compounds such as oxygen. Furthermore, it is preferred that the protective layer does not virtually inhibit the transmittance of light used for the exposure, has excellent adhesiveness to the photosensitive layer and can be easily removed at the development after the exposure.

Techniques for obtaining such a protective layer have been proposed and are described in detail, for example, in U.S. Pat. No. 3,458,311 and JP-A No. 55-49729. The material which can be used for the protective layer is preferably a water-soluble polymer compound having relatively excellent crystallinity, and specific examples are: water-soluble polymers such as polyvinyl alcohol, polyvinyl pyrrolidone, acidic celluloses, gelatin, gum arabi and polyacrylic acid. Among these, when polyvinyl alcohol is used as a main component, most preferred effects can be attained in view of the fundamental properties such as oxygen intercepting property or development separability.

The polyvinyl alcohol for use in the protective layer has required oxygen intercepting property and water solubility, accordingly, as far as an unsubstituted vinyl alcohol unit is contained, the polyvinyl alcohol may be partially substituted by an ester, ether or acetal. Further, the polyvinyl alcohol may partially have another copolymer component. Examples of the polyvinyl alcohol include those hydrolyzed at a ratio from 71 to 100% and having a molecular weight of 300 to 2,400.

With respect to commercially available products, specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all manufactured by Kuraray Co., Ltd.

The components (selection of PVA, use of additives) and coated amount of the protective layer are selected by taking account of the oxygen intercepting property, development separability, fogging property, adhesiveness and scratch resistance. In general, as the hydrolysis ratio of PVA to be used (namely, the content of unsubstituted vinyl alcohol unit in the protective layer) is higher and the layer thickness is larger, the oxygen intercepting property is more intensified and this is advantageous in view of sensitivity. However, if the oxygen intercepting property is intensified to an extreme extent, an unnecessary polymerization reaction takes place during the production or stock storage or undesired fogging or thickening of the line image is disadvantageously caused.

The adhesiveness to the image area and the scratch resistance are also very important in view of handling of the plate. More specifically, when a hydrophilic layer having a water-soluble polymer is laminated on a lipophilic photo-sensitive layer, the coating is readily stripped off due to the insufficient adhesive strength and the area from which the coating is stripped causes faults such as curing failure due to polymerization inhibition by oxygen. To solve this problem, various proposals have been made with an attempt to improve the adhesive property between these two layers. For example, U.S. Pat. No. 292,501 and U.S. Pat. No. 44,563 disclose a technique of mixing from 20 to 60% by weight of an acrylic emulsion or a water-insoluble vinyl pyrrolidone-vinyl acetate copolymer in a hydrophilic polymer mainly composed of polyvinyl alcohol and coating it on a photo-sensitive layer, thereby obtaining sufficiently high adhesive property.

Any of these known techniques can be applied to the invention. The coating method of such a protective layer is described in detail, for example, in U.S. Pat. No. 3,458,311 and JP-A No. 55-49729.

In order to produce a planographic printing plate from the planographic printing plate precursor of the invention, at least, exposing and developing processes are carried out.

With respect to the light-source for exposing the negative-type planographic printing plate precursor of the invention, known devices can be used without any limitation The light source preferably has a wavelength of 300 to 1200 nm, and more specifically, various laser light sources are suitably used, and in particular, an Infrared laser having a wavelength of 780 to 1200 nm is preferably used.

With respect to the exposure mechanism, any mechanism of inner surface drum system, outer surface drum system, flat bed system and the like may be used.

Other examples of the light source which can be used in the exposure of the negative-type planographic printing plate precursor of the invention include an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, a visible or ultraviolet laser lamp of various types, a fluorescent lamp, a tungsten lamp and sunlight.

After the exposure, the planographic printing plate precursor of the invention is normally subjected to a wet-type developing process. The developer for use in the development is preferably an aqueous alkaline solution having a pH of 14 or less, more preferably an aqueous alkaline solution containing an anionic surfactant and having a pH of 8 to 12.

For example, an inorganic alkali agent such as sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide, may be used. In addition, an organic alkali agent such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethyleneimine, ethylenediamine and pyridine, may also be used.

These alkali agents are used individually or in combination of two or more thereof.

In the development of the planographic printing plate of the invention, an anionic surfactant is added to the developer in an amount of 1 to 20% by weight, preferably from 3 to 10% by weight. If the amount added is too small, the developability deteriorates, whereas if it is excessively large, the strength such as abrasion resistance of the image disadvantageously decreases.

Examples of the anionic surfactant include higher alcohol sulfates having from 8 to 22 carbon atoms, such as sodium salt of lauryl alcohol sulfate, ammonium salt of lauryl alcohol sulfate, sodium salt of octyl alcohol sulfate, alkyl aryl sulfonic acid salts (e.g., sodium salt of isopropylnaphthalene sulfonic acid, sodium salt of isobutylnaphthalene sulfonic acid, sodium salt of polyoxyethylene glycol mononaphthylether sulfate, sodium salt of dodecylbenzene sulfonic acid, sodium salt of metanitrobenzene sulfonic acid) and secondary sodium alkyl sulfate; aliphatic alcohol phosphate salts such as sodium salt of cetyl alcohol phosphate; sulfonic acid salts of alkylamide, such as $C_{17}H_{33}CON(CH_3)CH_2CH_2SO_3Na$; and sulfonic acid salts of dibasic aliphatic ester, such as sodium dioctyl sulfosuccinate and sodium dihexyl sulfosuccinate.

If necessary, an organic solvent capable of mixing with water, such as benzyl alcohol, may be added to the developer.

The organic developer preferably has a water solubility of about 10% by weight or less, preferably 5% by weight or less. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol.

The organic solvent content is preferably from 1 to 5% by weight based on the total weight of the developer on use. The amount used has close relationship with the amount of surfactant used and as the amount of the organic solvent is increased, the amount of the anionic surfactant is preferably increased, because if the organic solvent is used in a large amount in the case when the anionic surfactant is in a small amount, the organic solvent does not dissolve and good developability cannot be ensured.

Furthermore, if necessary, additives such as defoaming agent and softening agent for hard water may be contained.

Examples of the softening agent for hard water include polyphosphates such as $Na_2P_2O_7$, $Na_5P_3O_3$, $Na_5P_3O_9$, $Na_2O_4P(NaO_3P)PO_3Na_2$ and Calgon (sodium polymetaphosphate); aminopolycarboxylic acids such as ethylenediaminetetraacetic acid, including sodium and potassium salts thereof, diethylenetriaminepentaacetic acid, including sodium and potassium salts thereof, triethylenetetraminehexaacetic acid, including sodium and potassium salts thereof, hydroxyethylethylenediaminetriacetic acid, including sodium and potassium salts thereof, nitrilotriacetic acid, including sodium and potassium salts thereof, 1,2-diaminocyclohexanetetraacetic acid, including sodium and potassium salts thereof and 1,3-diamino-2-propanol-tetraacetic acid, including sodium and potassium salts thereof; and organic phosphonic acids such as 2-phosphonobutanetricarboxylic acid-1,2,4, including potassium and sodium salts thereof, 2-phosphonobutanonetricarboxylic acid-2,3,4, including potassium and sodium salts thereof, 1-phosphonoethanetricarboxylic acid-1,2,2, including potassium and sodium salts thereof, 1-hydroxyethane-1,1-diphosphonic acid, including potassium and sodium salts thereof and aminotri (methylenephosphonic acid), including potassium and sodium salts thereof.

The optimal amount of the softening agent for hard water varies depending on the hardness and amount of the hard water to be used; however, the softening agent is generally contained in an amount of 0.01 to 5% by weight, preferably from 0.01 to 0.5% by weight, based on the developer on use.

In the case of continuously developing the planographic printing plate using an automatic developing machine, the developer becomes exhausted; therefore, according to the amount to be processed, the processing ability thereof may be recovered using a replenisher or a fresh developer. In this case, the replenisher or fresh developer is preferably supplied by the method described in U.S. Pat. No. 4,882,246. Moreover, the developers described in JP-A Nos. 50-26601, 58-54341, JP-B Nos. 56-39464, 56-42860 and 57-7427 are also preferably used.

The negative-type photo sensitive planographic printing plate thus developed is post-treated with washing water, rinsing solution containing a surfactant and the like, and desensitizing solution containing gum arabic, starch derivative or the like, as described in JP-A Nos. 54-8002, 55-115045 and 59-58431. In the post-treatment of the planographic printing plate obtained from the planographic printing plate precursor of the invention, these treatments may be used in various combinations.

With respect to the plate-forming process in the planographic printing plate precursor of the invention, if necessary, the entire surface thereof may be heated before the exposure, during the exposure, and from the exposure to the development. This heating process accelerates the image-forming reaction in the photosensitive layer, resulting in advantages such as improvements in the sensitivity and printing press life and stability in the sensitivity. Moreover, in an attempt to improve the image strength and printing press life, the image after the development may be effectively subjected to an entire-surface post-heating process or an entire-surface exposing process.

Normally, the heating process before development is preferably carried out under moderate conditions at a temperature of 150° C. or less. When the temperature is too high, an undesired curing reaction tends to take place in the non-image portions. The heating process after development is carried out under further intensified conditions. Normally, the process is carried out at a temperature in a range of 200 to 500° C. When the heating temperature after development is low, it is not possible to obtain a sufficient image-strengthening function, whereas when it is too high, problems such as thermal decomposition in the image portions tend to occur.

The planographic printing plate obtained through such treatments is mounted on an off-set printer and subjected to printing processes of a large number of sheets.

In order to remove stains on the plate at the printing, a plate cleaner is used and conventionally known plate cleaners for PS plates may be used. Examples thereof include CL-1, CL-2, CP, CN-4, CN, CG-1, PC-1, SR and IC (all manufactured by Fuji Photo Film Co., Ltd.).

EXAMPLES

The following description will discuss the present invention by means of examples; however, these examples should not be construed to limit the scope of the invention.

[Synthesis of Specific Binder Polymer]

Synthesis Example 1

Into acetone (1,000 ml) were dissolved cis-1,2-cyclohexane dicarboxylic anhydride (308.3 g), methacrylic acid (2-hydroxyethyl) (273.3 g) and 4-(dimethylamine) pyridine (4.9 g), and heated for 5 hours under reflux. After acetone had been distilled off under reduced pressure, 1N hydrochloric acid (500 ml) and ethyl acetate (2,000 ml) were added thereto so that an extracting process was carried out. After the organic layer had been washed with saturated saline solution (500 ml) twice, to this was added magnesium sulfuric anhydride (100 g) and this was allowed to stand for 1 hour to be dehydrated. After magnesium sulfate had been filtered and separated, ethyl acetate was distilled off under reduced pressure so that a white solid matter was obtained. After having been ground, this was added to water (2,000 ml), and after having been stirred for 2 hours, this was filtered and dried to obtain a white solid matter (518.9 g) of 2-[2-(methacryloyloxy)ethoxycarbonyl]cyclohexane carboxylic acid.

Synthesis Example 2

A 1-methoxy-2-propanol solution (23 g) containing methyl methacrylate (6.53 g), 2-[2-(methacryloyloxy) ethoxycarbonyl]cyclohexane carboxylic acid (13.47 g), obtained in synthesis example 1, and 0.1 g of 2,2'-azobis (2,4-dimethyl valeronitrile) was dripped into a 1-methoxy-2-propanol solution (23 g) at 70° C. under a nitrogen gas flow in 2.5 hours. After completion of the dripping process, this was further stirred for 2 hours at 70° C. After having been left and cooled, this solution was put into water (1 L) that was vigorously stirred, and further stirred for one hour. The deposited white powder was filtered and separated, and dried to obtain a binder polymer (P-1) (19 g) shown in Table 1. The weight average molecular weight of this polymer, measured by the Gelpermeation chromatography method was 100,000 based upon polystyrene conversion, and the acid value thereof was 2.3 meq/g.

Binder polymers (P-2) to (P-18), shown in Tables 1 and 2, were obtained through the same process. Here, structural units (PC-1) to (PC-18), which are represented by general formula (I) and used in these binder polymers, are shown below:

TABLE 1
| Binder polymer in first layer | Repeating structural unit represented by general formula (I) | Other copolymer components | Molecular weight | Acid value (meq/g) |
|---|---|---|---|---|
| P-1 | PC-1 | Methyl methacrylate | 100,000 | 2.3 |
| P-2 | PC-2 | | 100,000 | 2.5 |
| P-3 | PC-3 | | 80,000 | 2.3 |
| P-4 | PC-4 | | 90,000 | 2.5 |
| P-5 | PC-5 | | 70,000 | 2.5 |
| P-6 | PC-6 | | 80,000 | 3.0 |
| P-7 | PC-7 | | 90,000 | 3.0 |
| P-8 | PC-8 | | 110,000 | 3.0 |
| P-9 | PC-9 | | 120,000 | 3.0 |
| P-10 | PC-10 | | 150,000 | 2.5 |
| P-11 | PC-11 | | 80,000 | 2.5 |
| P-12 | PC-12 | | 90,000 | 3.0 |
| P-13 | PC-13 | | 110,000 | 2.5 |
| P-14 | PC-14 | | 70,000 | 3.0 |
| P-15 | PC-15 | | 90,000 | 2.5 |
| P-16 | PC-16 | | 110,000 | 2.7 |
| P-17 | PC-17 | | 100,000 | 2.6 |
| P-18 | PC-18 | | 120,000 | 3.0 |
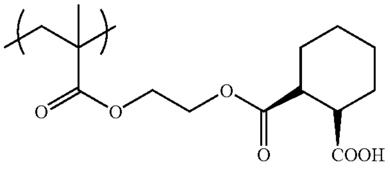
PC-1
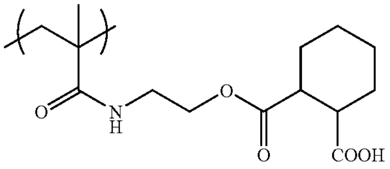
PC-2
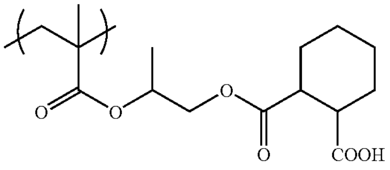
PC-3
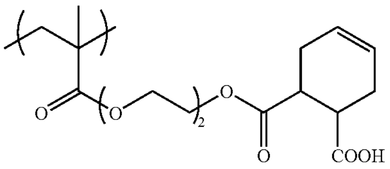
PC-4
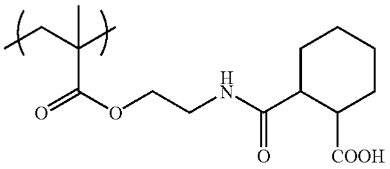
PC-5
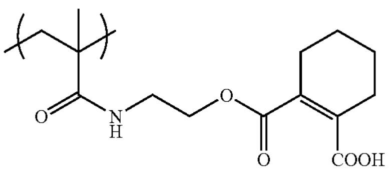
PC-6
TABLE 1-continued
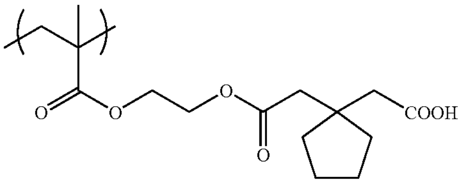
PC-7
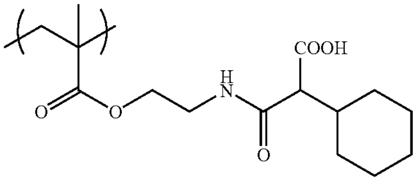
PC-8
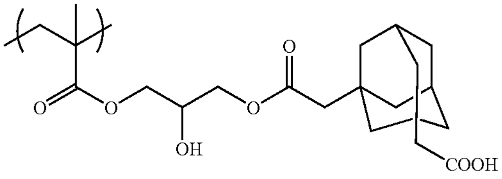
PC-9
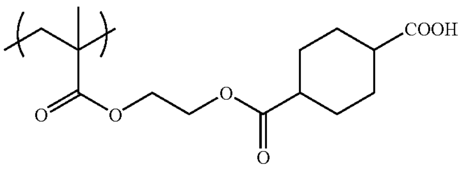
PC-10
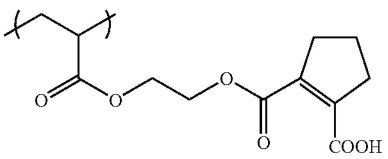
PC-11
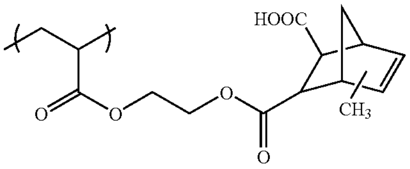
PC-12
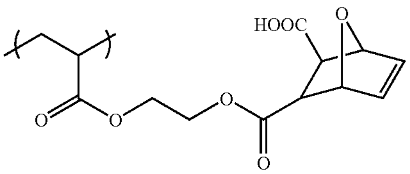
PC-13
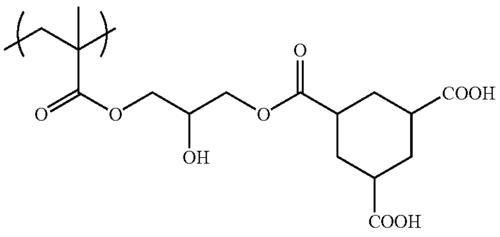
PC-14

TABLE 1-continued

PC-15

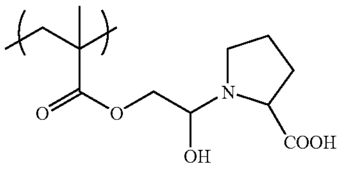

PC-16

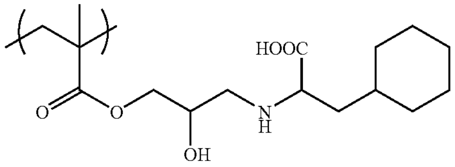

PC-17

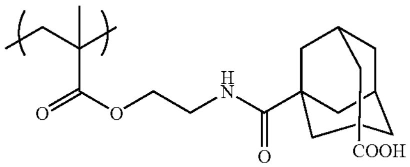

PC-18

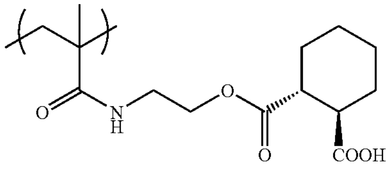

Examples 1 to 18

Planographic printing plate precursors were manufactured through the following processes, and printing performances thereof were evaluated.

1. Formation of Support

1-1. Preparation of Substrate

Fused alloy (JIS A105) containing aluminum of not less than 99.5%, Fe of 0.30%, Si of 0.10%, Ti of 0.02% and Cu of 0.013% was subjected to a purifying treatment, and forged. In the purifying process, a degassing process was carried out to remove unnecessary gases such as hydrogen from the fused alloy, and a ceramic tube filtering process was carried out thereon. With respect to the forging method, a DC forging method was used. The resulting solidified cast member having a plate thickness of 500 mm was ground to remove the surface thereof in a depth of 10 mm, and this was subjected to a homogenizing process at 550° C. for 10 hours so as not to allow the intermetal compounds to become bulky.

Next, this was then subjected to a hot rolling process at 400° C., and after having been subjected to an intermediate annealing process at 500° C. for 60 seconds in a continuous annealing furnace, this was subjected to a cold rolling process to form an aluminum rolled plate having a plate thickness of 0.30 mm. By controlling the roughness of the rolled plate, the center-line average surface roughness Ra after the cold rolling process was adjusted to 0.2 μm. Thereafter, this was fed to a tension leveler so as to improve its flatness.

Next, this was subjected to a surface treatment so as to form a planographic printing plate support.

First, in order to remove rolling oil from the surface of the aluminum plate, the aluminum plate was subjected to a degreasing process in an aqueous solution of 10% alminic acid soda at 50° C. for 30 seconds and then subjected to neutralizing and smut-removing processes in a 30% aqueous solution of sulfuric acid at 50° C. for 30 seconds.

Next, in order to improve the adhesiveness between the support and the recording layer and to impart a water-holding property to non-image areas, a so-called blasting process for roughening the surface of the substrate was carried out. More specifically, an aqueous solution containing 1% of nitric acid and 0.5% of aluminum nitrate was maintained at 45° C., and while the aluminum web was being fed through the aqueous solution, an anode side electricity of 240 $C/dm^2$ with the current density of 20 $A/dm^2$ and an alternating waveform of a duty ratio of 1:1 was applied thereto by using an indirect power-supply cell so that the electrolytic surface roughening process was carried out. Thereafter, this was subjected to an etching process in a 10% alminic acid soda aqueous solution at 50° C. for 30 minutes, and then subjected to neutralizing and smut-removing processes in an aqueous solution of sulfuric acid of 30% at 50° C. for 30 seconds.

Moreover, in order to improve the abrasion resistance, chemical resistance and water-holding property, an oxide coat film was formed on the support through an anodic oxidation process. An aqueous solution containing sulfuric acid of 20% was used as an electrolyte at 35° C., and an electrolytic process was carried out by applying a direct current of 14 $A/dm^2$ through an indirect power-supply cell, while feeding the aluminum web through the electrolyte, so that an anodic oxide coat film of 2.5 $g/m^2$ was formed.

Thereafter, in order to enhance the hydrophilic property at the printing plate non-image portions, this was subjected to a silicate process. In this process, a 1.5% aqueous solution of no.3 silicate soda was maintained at 70° C., and the aluminum web was fed through the solution so as to make the web in contact with the solution for 15 seconds, and then washed with water. The amount of adhesiveness of Si was 10 $mg/m^2$.

The substrate, formed as described above, had an Ra (center-line surface roughness) of 0.25 μm.

1-2. Formation of Intermediate Layer by Coating

The coating solution for forming an intermediate layer that had the following composition was applied onto the above-mentioned substrate with wire bar, and dried at 90° C. for 30 seconds by using a hot-air drying device to prepare a support. The amount of coating after drying was 10 $mg/m^2$.

(Coating Solution for Forming Intermediate Layer)

| | |
|---|---|
| Copolymer between ethyl methacrylate and sodium 2-acrylamide-2-methyl-1-propane sulfonate at a molar ratio of 75:15 | 0.1 g |
| 2-aminoethyl phosphoric acid | 0.1 g |
| Methanol | 50 g |
| Ion exchange water | 50 g |

2. Formation of Image Recording Layer by Coating

2-1. Formation of First Layer

The following coating solution for forming first layer was applied onto the above-mentioned support with wire bar, and dried at 125° C. for 45 seconds by using a hot-air drying device to prepare a first layer. The amount of coating after drying was 0.5 $g/m^2$.

(Coating Solution for Forming First Layer)

| | |
|---|---|
| Binder polymer (Compound shown in Table 2) | 0.5 g |
| Fluorine-based surfactant (MEGAFACE F-176, manufactured by Dai-Nippon Ink & Chemicals, Inc.) | 0.01 g |
| Methyl ethyl ketone | 10 g |
| Dimethyl acetamide | 12 g |
| Methanol | 5 g |

2-2. Formation of Second Layer

The following coating solution for forming second layer was applied onto the above-mentioned first layer with wire bar, and dried at 125° C. for 27 seconds by using a hot-air drying device to form a second layer; thus, a planographic printing plate precursor was prepared. The amount of coating after drying the second layer was 1.5 $g/m^2$.

(Coating Solution for Forming Second Layer)

| | |
|---|---|
| Addition polymerizable compound (Dipentaerythritol hexacrylate) | 1.5 g |
| Binder polymer (Copolymer between allyl methacrylate and methacrylic acid, acid value 2.7 meq/g, weight average molecular weight 120,000) | 2.0 g |
| Sensitizing pigment (IR absorber: compound shown in Table 2) | 0.2 g |
| Photo-polymerization initiator (Compound shown in Table 2) | 0.4 g |
| Co-sensitizer (Compound shown in Table 2) | 0.4 g |
| Fluorine-based nonionic surfactant (MEGAFACE F-177, manufactured by Dai-Nippon Ink & Chemicals, Inc.) | 0.03 g |
| Thermo-polymerization inhibitor (N-nitrosophenylhydroxyl amine aluminum salt) | 0.01 g |
| Coloring pigment dispersant having the following composition | 2.0 g |
| Methyl ethyl ketone | 20.0 g |
| Propylene glycol monomethyl ether | 20.0 g |

(Composition of Coloring Pigment Dispersant)

| | |
|---|---|
| Pigment Blue 15:6 | 15 parts by weight |
| Allyl methacrylate/methacrylic acid copolymer (Copolymer molar ratio 80/20, weight average molecular weight: 40,000) | 10 parts by weight |
| Cyclohexanone | 15 parts by weight |
| Methoxypropyl acetate | 20 parts by weight |
| Propylene glycol monomethyl ether | 40 parts by weight |

Comparative Example 1

A negative-type photosensitive composition having the following composition was coated on the support obtained in the above-mentioned examples to have a coated weight of 1.5 $g/m^2$ after drying and then dried at 100° C. for 1 minute to form an image recording layer; thus, a planographic printing plate precursor of comparative example 1 was obtained.

(Photosensitive Composition)

| | |
|---|---|
| Addition polymerizable compound (Dipentaerythritol hexacrylate) | 1.5 g |
| Binder polymer (Copolymer between allyl methacrylate and methacrylic acid acid value 2.7 meq/g, weight average molecular weight 120,000) | 2.0 g |
| Sensitizing pigment (IR absorber: compound shown in Table 2) | 0.2 g |
| Photo-polymerization initiator (Compound shown in Table 2) | 0.4 g |
| Co-sensitizer (Compound shown in Table 2) | 0.4 g |
| Fluorine-based nonionic surfactant (MEGAFACE F-177, manufactured by Dai-Nippon Ink & Chemicals, Inc.) | 0.03 g |
| Thermo-polymerization inhibitor (N-nitrosophenylhydroxyl amine aluminum salt) | 0.01 g |
| Coloring pigment dispersant having the above-mentioned composition | 2.0 g |
| Methyl ethyl ketone | 20.0 g |
| Propylene glycol monomethyl ether | 20.0 g |

TABLE 2

| | Image recording layer | | | | | Press life | | | |
|---|---|---|---|---|---|---|---|---|---|
| No. | First layer (Binder) | Photo-polymerization initiator in second layer | Sensitizing pigment in second layer | Co-sensitizer in second layer | Developer | Image area (sheets) | Halftone area | Developing rate (nm/sec) | Developer Permeation rate (nF/sec) |
| Example 1 | P-1 | I-1 | S-1 | C-1 | D-1 | 400,000 | ◎ | 450 | 80 |
| Example 2 | P-2 | I-1 | S-2 | C-2 | D-1 | 380,000 | ◎ | 400 | 80 |
| Example 3 | P-3 | I-2 | S-1 | C-1 | D-2 | 370,000 | ○ | 350 | 80 |
| Example 4 | P-4 | I-1 | S-2 | C-3 | D-1 | 330,000 | ○ | 350 | 90 |
| Example 5 | P-5 | I-1 | S-2 | C-2 | D-1 | 340,000 | ○ | 380 | 90 |
| Example 6 | P-6 | I-2 | S-2 | C-1 | D-1 | 370,000 | ◎ | 350 | 85 |
| Example 7 | P-7 | I-1 | S-1 | C-1 | D-2 | 350,000 | ○ | 380 | 85 |
| Example 8 | P-8 | I-1 | S-1 | C-2 | D-1 | 380,000 | ◎ | 350 | 85 |
| Example 9 | P-9 | I-2 | S-2 | C-3 | D-1 | 340,000 | ○ | 380 | 90 |

TABLE 2-continued

| No. | Image recording layer: First layer (Binder) | Photo-polymerization initiator in second layer | Sensitizing pigment in second layer | Co-sensitizer in second layer | Developer | Press life: Image area (sheets) | Press life: Halftone area | Developing rate (nm/sec) | Developer Permeation rate (nF/sec) |
|---|---|---|---|---|---|---|---|---|---|
| Example 10 | P-10 | I-2 | S-1 | C-3 | D-2 | 330,000 | ○ | 380 | 90 |
| Example 11 | P-11 | I-1 | S-1 | C-1 | D-2 | 400,000 | ◎ | 380 | 95 |
| Example 12 | P-12 | I-1 | S-2 | C-2 | D-1 | 310,000 | ○ | 370 | 85 |
| Example 13 | P-13 | I-2 | S-2 | C-2 | D-1 | 320,000 | ○ | 370 | 85 |
| Example 14 | P-14 | I-1 | S-1 | C-1 | D-2 | 330,000 | ◎ | 400 | 90 |
| Example 15 | P-15 | I-1 | S-1 | C-1 | D-2 | 360,000 | ◎ | 400 | 90 |
| Example 16 | P-16 | I-2 | S-2 | C-1 | D-1 | 380,000 | ◎ | 400 | 85 |
| Example 17 | P-17 | I-1 | S-2 | C-2 | D-1 | 360,000 | ○ | 380 | 90 |
| Example 18 | P-18 | I-1 | S-1 | C-3 | D-2 | 380,000 | ◎ | 400 | 90 |
| Comparative Example 1 | — | (I-1) | (S-1) | (C-1) | D-1 | 180,000 | X | 300 | 150 |

◎: Very good,
○: Good,
X: Plate slipping

The structures of the photo-polymerization initiator, sensitizing pigment, co-sensitizer described in Table 2 are shown below:

I-1

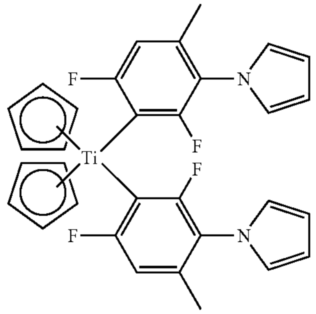

I-2

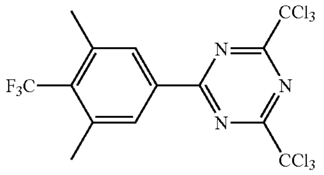

S-1

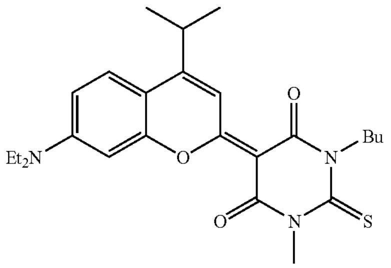

-continued

S-2

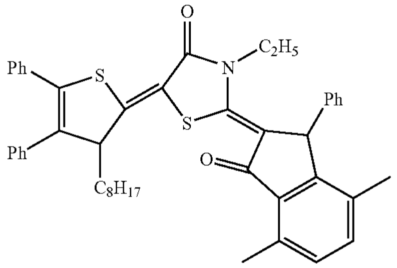

C-1

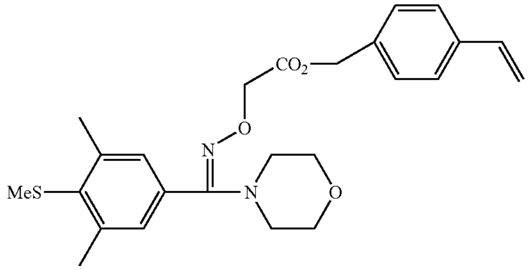

C-2

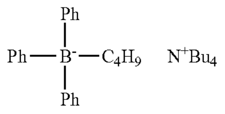

C-3

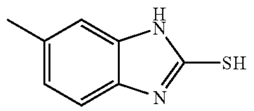

3. Evaluation of Planographic Printing Plate Precursor 3-1. Exposure of Planographic Printing Plate Precursor Each of the planographic printing plate precursors obtained in the examples and comparative example was subjected to a solid-image exposing process and halftone-image exposing processes from 1 to 99% in units of 1%, with 2540 dpi and 175 lines/inch, by using a FD-YAG (532 nm) laser exposing machine (Plate Setter: Gutenberg, manufactured by Heiderberg) while controlling the exposure power to give an exposure energy density of 200 μJ/cm$^2$ on the plate surface.

3-2 Development/Plate-Making

Each of the developers shown in Table 2 and Finisher FP-2W manufactured by Fuji Photo Film Co., Ltd. were charged into an automatic developing machine FLP-813 manufactured by Fuji Photo Film Co., Ltd., and the exposed plate was developed/processed for plate-making at a developer temperature of 30° C. for a development time of 18 seconds to obtain a planographic printing plate.

The compositions of the developers described in the Table are shown below:

<Composition of Developer D-1>

Aqueous solution of pH 10 having the following composition

| | |
|---|---|
| Monoethanol amine | 0.1 parts by weight |
| Triethanol amine | 1.5 parts by weight |
| Compound represented by the following formula (1) | 4.0 parts by weight |
| Compound represented by the following formula (2) | 2.5 parts by weight |
| Compound represented by the following formula (3) | 0.2 parts by weight |
| Water | 91.7 parts by weight |

Formula (1)

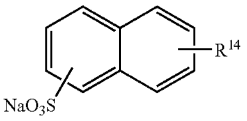

Formula (2)

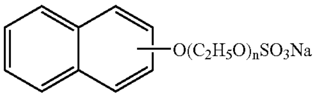

Formula (3)

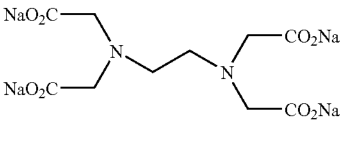

In the above-mentioned formula (1), R$^{14}$ represents a hydrogen atom or a butyl group.

<Composition of Developer D-2 (pH=12.8)>

Aqueous solution having the following composition

| | |
|---|---|
| 1K potassium silicate | 3.0 parts by weight |
| Potassium hydroxide | 1.5 parts by weight |
| Compound represented by the above-mentioned formula (3) | 0.2 parts by weight |
| Water | 95.3 parts by weight |

3-3. Image Area Printing Press Life Test

The test was carried out by using a printer R201 manufactured by Rholand and an ink Graph-G(N) manufactured by Dai-Nippon Ink & Chemicals, Inc. The printed matter of the solid image area was observed and the printing press life was evaluated by the number of sheets when the image began thinning. A larger numeral means a longer printing press life. The results are shown in the above Table 2.

3-4 Forced Test of Printing Press Life of Halftone Area

The test was carried out by using a printer R201 manufactured by Rholand and an ink Graph-G(N) manufactured by Dai-Nippon Ink & Chemicals, Inc. At the 5,000th sheet from the initiation of printing, the halftone area was wiped off with a printing sponge impregnated with PS plate cleaner CL-2 manufactured by Fuji Photo Film Co., Ltd. to wash the ink on the plate surface. Thereafter, 10,000 sheets were printed and the presence or absence of the plate slipping in the half tone area on the printed matter was visually observed. The results are also shown in Table 2.

As clearly shown in Table 2, the planographic printing plate obtained from the planographic printing plate precursor of the invention was superior in the printing press life at the image area without any plate slipping at the halftone area, and was also superior in the printing press life at the halftone area. In contrast, the planographic printing plate precursor of comparative example 1, which had the same composition as the second layer of example 1, exhibited a low developing rate with a high permeation rate of the developer, resulting in degradation in the printing press life at the halftone area.

Examples 19 to 36

4. Formation of Image Recording Layer by Coating 4-1. Formation of First Layer

The following coating solution for forming first layer was applied onto the support obtained in the above-mentioned examples 1 to 18 with wire bar, and dried at 125° C. for 45 seconds by using a hot-air drying device to form a first layer. The amount of coating after drying was 0.5 g/m$^2$.

(Coating Solution for Forming First Layer)

| | |
|---|---|
| Binder polymer (Compound shown in Table 3) | 0.5 g |
| Fluorine-based surfactant (MEGAFACE F-176, manufactured by Dai-Nippon Ink & Chemicals, Inc.) | 0.01 g |
| Methyl ethyl ketone | 10 g |
| Dimethyl acetamide | 12 g |
| Methanol | 5 g |

4-2. Formation of Second Layer

The following coating solution for forming second layer was applied onto the above-mentioned first layer with wire bar, and dried at 125° C. for 27 seconds by using a hot-air drying device to form a second layer; thus, a planographic printing plate precursor was prepared. The amount of coating after drying the second layer was 1.5 g/$m^2$.

(Coating Solution for Forming Second Layer)

| | |
|---|---|
| Addition polymerizable compound (Dipentaerythritol hexacrylate) | 1.5 g |
| Binder polymer (Copolymer between allyl methacrylate and methacrylic acid, acid value 2.7 meq/g, weight average molecular weight 120,000) | 2.0 g |
| IR absorber (IR-1) | 0.08 g |
| Thermo-polymerization initiator (OI-2) | 0.3 g |
| Fluorine-based nonionic surfactant (MEGAFACE F-176, manufactured by Dai-Nippon Ink & Chemicals, Inc.) | 0.01 g |
| Naphthalene sulfonate of Victoria Pure Blue | 0.04 g |
| Methyl ethyl ketone | 9.0 g |
| Propylene glycol monomethyl ether | 8.0 g |
| Methanol | 10.0 g |

Comparative Example 2

Formation of Image Recording Layer by Coating

The following coating solution for forming the image recording layer was prepared, and coated on the aluminum substrate with wire bar in the same amount as in the Comparative Example 1, and then dried at 115° C. for 45 seconds to form an image recording layer.

(Coating Solution for Forming Image Recording Layer)

| | |
|---|---|
| Addition polymerizable compound (Dipentaerythritol hexacrylate) | 1.5 g |
| Binder polymer (Copolymer between allyl methacrylate and methacrylic acid, acid value 2.7 meq/g, weight average molecular weight 120,000) | 2.5 g |
| IR absorber (IR-1) | 0.08 g |
| Thermo-polymerization initiator (OS-8) | 0.3 g |
| Fluorine-based nonionic surfactant (MEGAFACE F-176, manufactured by Dai-Nippon Ink & Chemicals, Inc.) | 0.01 g |
| Naphthalene sulfonate of Victoria Pure Blue | 0.04 g |
| Methyl ethyl ketone | 9.0 g |
| Propylene glycol monomethyl ether | 8.0 g |
| Methanol | 10.0 g |

The structures of the IR absorber used in examples 19 to 36 and comparative example 2 and the thermo-polymerization initiator described in Table 3 are shown below:

TABLE 3

| | Image recording layer | | | Printing press life | | | |
|---|---|---|---|---|---|---|---|
| No. | First layer (Binder) | Thermo-polymerization initiator in second layer | Developer | Image area (sheets) | Halftone area | Developing rate (nm/sec) | Developer Permeation rate (nF/sec) |
| Example 19 | P-1 | OI-11 | D-4 | 380,000 | ◎ | 450 | 75 |
| Example 20 | P-2 | OI-11 | D-3 | 380,000 | ◎ | 400 | 75 |
| Example 21 | P-3 | OS-8 | D-4 | 340,000 | ○ | 350 | 90 |
| Example 22 | P-4 | OI-11 | D-1 | 360,000 | ○ | 350 | 90 |
| Example 23 | P-5 | ON-6 | D-3 | 320,000 | ○ | 300 | 90 |
| Example 24 | P-6 | OI-11 | D-3 | 350,000 | ◎ | 350 | 90 |
| Example 25 | P-7 | OS-8 | D-3 | 360,000 | ○ | 300 | 80 |
| Example 26 | P-8 | ON-6 | D-4 | 360,000 | ◎ | 310 | 85 |
| Example 27 | P-9 | ON-6 | D-1 | 340,000 | ○ | 320 | 90 |
| Example 28 | P-10 | OS-8 | D-1 | 330,000 | ○ | 320 | 95 |
| Example 29 | P-11 | OS-8 | D-3 | 330,000 | ◎ | 320 | 90 |
| Example 30 | P-12 | OI-11 | D-2 | 320,000 | ○ | 320 | 95 |
| Example 31 | P-13 | ON-6 | D-1 | 310,000 | ○ | 340 | 80 |
| Example 32 | P-14 | OI-11 | D-4 | 310,000 | ○ | 390 | 75 |
| Example 33 | P-15 | OI-11 | D-4 | 330,000 | ◎ | 390 | 75 |
| Example 34 | P-16 | OS-8 | D-1 | 360,000 | ◎ | 390 | 80 |
| Example 35 | P-17 | ON-6 | D-3 | 350,000 | ○ | 310 | 80 |
| Example 36 | P-18 | OS-8 | D-4 | 400,000 | ◎ | 500 | 70 |
| Comparative Example 2 | Coating solution for forming image recording layer described above | | D-4 | 290,000 | X | 400 | 150 |

◎: Very good,
○: Good,
X: Plate slipping

IR-1

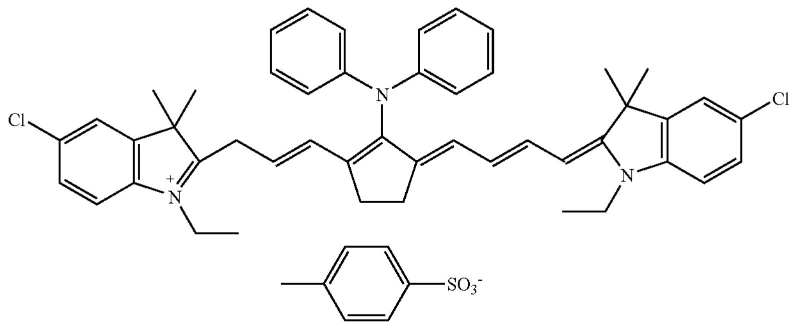

OI-11

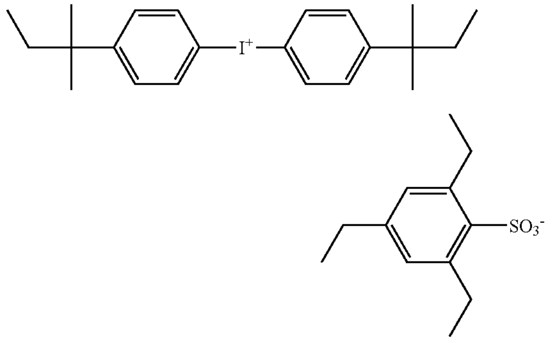

OS-8

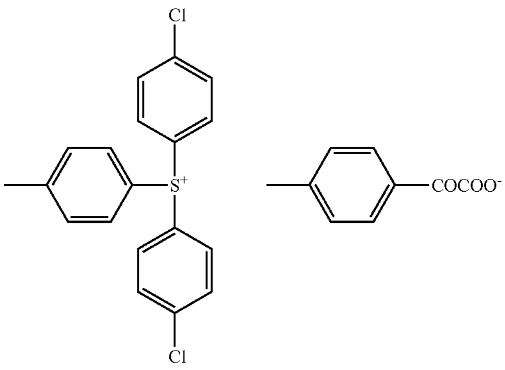

ON-6

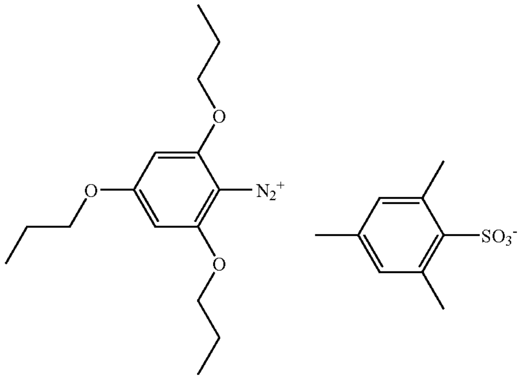

5. Formation of Protective Layer by Coating

An aqueous solution containing 3% by weight of polyvinyl alcohol (saponification degree: 98% by mol, polymerization degree: 550) was coated on the above-mentioned image recording layer to have a dry coated weight of 2 g/$m^2$, and then dried at 100° C. for 2 minutes; thus, a planographic printing plate precursor was obtained.

6. Evaluation of Planographic Printing Plate Precursor 6-1. Exposure of Planographic Printing Plate Precursor The planographic printing plate precursor obtained as described above was subjected to an exposing process by using a Trendsetter 3244 VFS manufactured by Creo Inc. equipped with a water-cooling-type 40W infrared semiconductor laser under the conditions of an output of 9 W, the number of revolution of 210 rpm in the outer surface drum, plate surface energy of 100 mJ/$cm^2$ and a resolution of 2400 dpi.

6-2. Development/Plate-Making

After the exposing process, the developer shown in Table 3 and a 1:1 diluted aqueous developer of Finisher FN-6 manufactured by Fuji Photo Film Co., Ltd. were charged into an automatic developing machine Stabron 900N manufactured by Fuji Photo Film Co., Ltd., and the exposed plate was developed/processed for plate-making at a temperature of 30° C. to obtain a planographic printing plate.

6-3. Image Area Printing Press Life Test

The test was carried out by using a Threron manufactured by Komori Corporation as a printing machine and an ink Graph-G(N) manufactured by Dai-Nippon Ink & Chemicals, Inc. The printed matter of the solid image area was observed and the printing press life was evaluated by the number of sheets when the image began thinning. A larger numeral means a longer printing press life. The results are shown in the above Table 3.

6-4 Forced Test of Printing Press Life of Halftone Area

The test was carried out by using a Threron manufactured by Komori Corporation as a printing machine and an ink Graph-G(N) manufactured by Dai-Nippon Ink & Chemicals, Inc. At the 5,000th sheet from the initiation of printing, the halftone area was wiped off with a printing sponge impregnated with PS plate cleaner CL-2 manufactured by Fuji Photo Film Co., Ltd. to wash the ink on the plate surface. Thereafter, 10,000 sheets were printed and the presence or absence of the plate slipping in the half tone area on the printed matter was visually observe. The results are also shown in Table 3.

The composition of the developer listed on Table 3 is shown below:

<Composition of Developer D-3 (pH=10.5)>

| | |
|---|---|
| Monoanhydride of sodium carbonate | 10 g |
| Potassium hydrogencarbonate | 10 g |
| Sodium isopropylnaphthalene sulfonate | 15 g |
| Sodium dibutylnaphthalene sulfonate | 15 g |
| Sodium ethylene glycol mononaphthyl ether monosulfate | 10 g |
| Sodium sulfite | 1 g |
| Tetrasodium ethylenediamine tetraacetate | 0.1 g |
| Ion exchange water | 938.9 g |

<Composition of Developer D-4 (pH=12.0)>

| | |
|---|---|
| Pure water | 95 g |
| Compound represented by the following formula (4) | 5 g |
| KOH | 0.06 g |
| Potassium carbonate | 0.2 g |
| Compound represented by the following formula (5) | 0.2 g |

Formula (4)

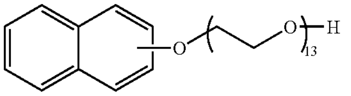

Formula (5)

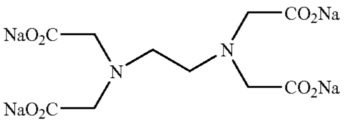

As clearly shown in Table 3, the planographic printing plate obtained from the planographic printing plate precursor of the invention was superior in the printing press life at the image area without any plate slipping at the halftone area, and was also superior in the printing press life at the halftone area. In contrast, the planographic printing plate precursor of comparative example 2 had a high permeation rate of the developer although it had a developing rate similar that of the present invention, resulting in degradation particularly in the printing press life at the halftone area.

The planographic printing plate precursor of the invention, which records images by using an infrared laser, enables direct recording from digital data of a computer and the like. The planographic printing plate precursor of the invention is superior in printing press life, has good image-forming properties, and thus provides high-quality images.

What is claimed is:

1. A planographic printing plate precursor comprising:

a support; and an image recording layer which has a two-layer structure including a first layer containing a binder polymer and a second layer containing a binder polymer, a polymerization initiator, a polymerizable compound, and an IR absorber, the first layer and the second layer having different curing properties, wherein:

after being exposed with a laser beam, a developing rate of an unexposed portion of the image recording layer by an alkaline developer having a pH of 10 to 13.5 is 100 nm/sec or more, where the developing rate refers to a value obtained by dividing a film thickness (nm) of the image recording layer by an amount of time (sec) required to develop the image recording layer; and after being exposed with a laser beam, a permeation rate of the alkaline developer to an exposed portion of the image recording layer is 100 nF/sec or less, where the permeation rate refers to a value indicating a rate of change of electrostatic capacity (F) when the image recording layer is formed on a conductive support, and dipped in the developer; and wherein the binder polymer in the first layer contains a polymer having a repeating structural unit represented by the following general formula (I):

General formula (I)

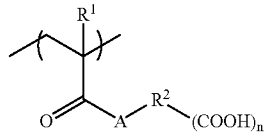

wherein $R^1$ represents a hydrogen atom or a methyl group; $R^2$ represents an (n+1) valent substituted or unsubstituted hydrocarbon group having an alicyclic structure with 3 to 30 carbon atoms in which one or more carbon atoms of $R^2$ may be replaced by an oxygen atom or a nitrogen atom; A represents an oxygen atom or a $NR^3$ group in which $R^3$ represents a hydrogen atom or a substituted or unsubstituted monovalent hydrocarbon group having 1 to 10 carbon atoms; and n represents an integer from 1 to 5.

2. The planographic printing plate precursor of claim 1, wherein the binder polymer in the first layer has an alkali soluble group and a hydrophobic group.

3. The planographic printing plate precursor of claim 1, wherein the first layer has a thickness after drying in a range of 0.01 to 1.5 μm.

4. The planographic printing plate precursor of claim 1, wherein the polymerization initiator is a radical generator.

5. The planographic printing plate precursor of claim 1, wherein the polymerization initiator is a thermally decomposing radical generator.

6. The planographic printing plate precursor of claim 1, wherein the second layer further contains a co-sensitizer.

7. A planographic printing plate precursor comprising:

a support; and an image recording layer which has a two-layer structure including a first layer containing a binder polymer and a second layer containing a binder polymer, a polymerization initiator, a polymerizable compound, and an IR absorber, the first layer and the second layer having different curing properties, wherein the binder polymer in the first layer contains a polymer having a repeating structural unit represented by the following general formula (I):

General formula (I)

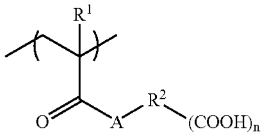

wherein $R^1$ represents a hydrogen atom or a methyl group; $R^2$ represents an (n+1) valent substituted or unsubstituted hydrocarbon group having an alicyclic structure with 3 to 30 carbon atoms in which one or more carbon atoms of $R^2$ may be replaced by an oxygen atom or a nitrogen atom; A represents an oxygen atom or a $NR^3$ group in which $R^3$ represents a hydrogen atom or a substituted or unsubstituted monovalent hydrocarbon group having 1 to 10 carbon atoms; and n represents an integer from 1 to 5.

8. The planographic printing plate precursor of claim 7, wherein:

after being exposed with a laser beam, a developing rate of an unexposed portion of the image recording layer by an alkaline developer having a pH of 10 to 13.5 is 100 to 300 nm/sec, where the developing rate refers to a value obtained by dividing a film thickness (nm) of the image recording layer by an amount of time (sec) required to develop the image recording layer; and after being exposed with a laser beam, a permeation rate of the alkaline developer to an exposed portion of the image recording layer is 80 nF/sec or less, where the permeation rate refers to a value indicating a rate of change of electrostatic capacity (F) when the image recording layer is formed on a conductive support, and dipped in the developer.

9. The planographic printing plate precursor of claim 7, wherein the binder polymer in the first layer has an alkali soluble group and a hydrophobic group.

10. The planographic printing plate precursor of claim 7, wherein the first layer has a thickness after drying in a range of 0.01 to 1.5 μm.

11. The planographic printing plate precursor of claim 7, wherein the polymerization initiator is a radical generator.

12. The planographic printing plate precursor of claim 7, wherein the polymerization initiator is a thermally decomposing radical generator.

13. The planographic printing plate precursor of claim 7, wherein the second layer further contains a co-sensitizer.

14. The planographic printing plate precursor of claim 7, wherein the binder polymer in the first layer contains a copolymer containing the repeating structural unit represented by general formula (I) and another copolymer component, and the repeating structural unit represented by general formula (I) is contained in the copolymer in an amount of 1 to 99% by mol based on a total polymer content.

15. The planographic printing plate precursor of claim 7, wherein the binder polymer in the first layer has a molecular weight of 2,000 to 1,000,000.

16. The planographic printing plate precursor of claim 7, wherein the binder polymer in the first layer has an acid value (meq/g) in a range of 2.00 to 3.60.

17. The planographic printing plate precursor of claim 7, wherein the polymerization initiator is an onium salt.

18. The planographic printing plate precursor of claim 1, wherein the binder polymer in the second layer is allyl methacrylate/methacrylic acid copolymer.

19. The planographic printing plate precursor of claim 7, wherein the binder polymer in the second layer is allyl methacrylate/methacrylic acid copolymer.

* * * * *